United States Patent
Kuwabara et al.

(10) Patent No.: US 10,418,321 B2
(45) Date of Patent: Sep. 17, 2019

(54) SEMICONDUCTOR DEVICE

(71) Applicant: RENESAS ELECTRONICS CORPORATION, Tokyo (JP)

(72) Inventors: Shinichi Kuwabara, Ibaraki (JP); Tetsuya Iida, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/954,213

(22) Filed: Apr. 16, 2018

(65) Prior Publication Data

US 2018/0366409 A1 Dec. 20, 2018

(30) Foreign Application Priority Data

Jun. 20, 2017 (JP) .................. 2017-120798

(51) Int. Cl.
*H01L 23/522* (2006.01)
*H01L 23/31* (2006.01)
(Continued)

(52) U.S. Cl.
CPC .. *H01L 23/5227* (2013.01); *H01L 21/823871* (2013.01); *H01L 23/3114* (2013.01); *H01L 23/528* (2013.01); *H01L 23/552* (2013.01); *H01L 23/645* (2013.01); *H01L 24/32* (2013.01); *H01L 25/0655* (2013.01);
(Continued)

(58) Field of Classification Search
CPC ............. H01L 23/645; H01L 23/49513; H01L 23/4952; H01L 28/10; H01L 23/5227; H01L 25/0657; H01L 23/3114; H01L 23/528; H01L 23/552; H01L 25/50; H01L 25/0655; H01L 21/823871; H01L 23/49541; H01L 2225/0651; H01L 2225/06531; H01L 2225/06534; H01F 27/2804; H01F 27/24; H01F 2027/2809
See application file for complete search history.

(56) References Cited

U.S. PATENT DOCUMENTS 8,358,009 B2  1/2013 Furumiya et al.
8,378,470 B2  2/2013 Nakashiba et al.
(Continued)

FOREIGN PATENT DOCUMENTS

JP  2011-054800 A  3/2011
JP  2015-046622 A  3/2015

*Primary Examiner* — Roy K Potter
(74) *Attorney, Agent, or Firm* — McDermott Will & Emery LLP

(57) ABSTRACT

A compact semiconductor device with an isolator. The semiconductor device includes two chips, namely a first semiconductor chip and a second semiconductor chip which are stacked with the main surfaces of the semiconductor chips partially facing each other. A first coil and a second coil which are formed in the first semiconductor chip and the second semiconductor chip respectively are arranged to face each other so as to be magnetically coupled during operation of the semiconductor device. The pair of first and second coils make up an isolator. The first coil is arranged in a manner to overlap part of the circuit region of the first semiconductor chip in plan view and the second coil is arranged in a manner to overlap part of the circuit region of the second semiconductor chip in plan view.

16 Claims, 16 Drawing Sheets

(51) Int. Cl.
*H01L 23/528* (2006.01)
*H01L 23/64* (2006.01)
*H01L 23/552* (2006.01)
*H01L 21/8238* (2006.01)
*H01L 25/00* (2006.01)
*H01L 25/065* (2006.01)
*H01L 23/00* (2006.01)
*H01L 23/495* (2006.01)
*H01L 23/532* (2006.01)
*H01L 21/265* (2006.01)

(52) U.S. Cl.
CPC .......... *H01L 25/0657* (2013.01); *H01L 25/50* (2013.01); *H01L 21/26513* (2013.01); *H01L 21/823878* (2013.01); *H01L 21/823892* (2013.01); *H01L 23/49541* (2013.01); *H01L 23/49551* (2013.01); *H01L 23/49575* (2013.01); *H01L 23/53228* (2013.01); *H01L 24/45* (2013.01); *H01L 24/48* (2013.01); *H01L 24/73* (2013.01); *H01L 2224/05554* (2013.01); *H01L 2224/0603* (2013.01); *H01L 2224/32145* (2013.01); *H01L 2224/32245* (2013.01); *H01L 2224/45144* (2013.01); *H01L 2224/45147* (2013.01); *H01L 2224/48091* (2013.01); *H01L 2224/48137* (2013.01); *H01L 2224/48245* (2013.01); *H01L 2224/48247* (2013.01); *H01L 2224/48465* (2013.01); *H01L 2225/0651* (2013.01); *H01L 2225/06531* (2013.01); *H01L 2225/06534* (2013.01); *H01L 2225/06562* (2013.01); *H01L 2924/13055* (2013.01); *H01L 2924/181* (2013.01); *H01L 2924/3025* (2013.01)

(56) References Cited

U.S. PATENT DOCUMENTS

| | | | |
|---|---|---|---|
| 9,984,959 B2 * | 5/2018 | Shuto | H01L 23/49541 |
| 2013/0130442 A1 * | 5/2013 | Nakashiba | H01L 23/48 438/109 |
| 2015/0001948 A1 * | 1/2015 | Brauchler | H01F 19/08 307/104 |

* cited by examiner

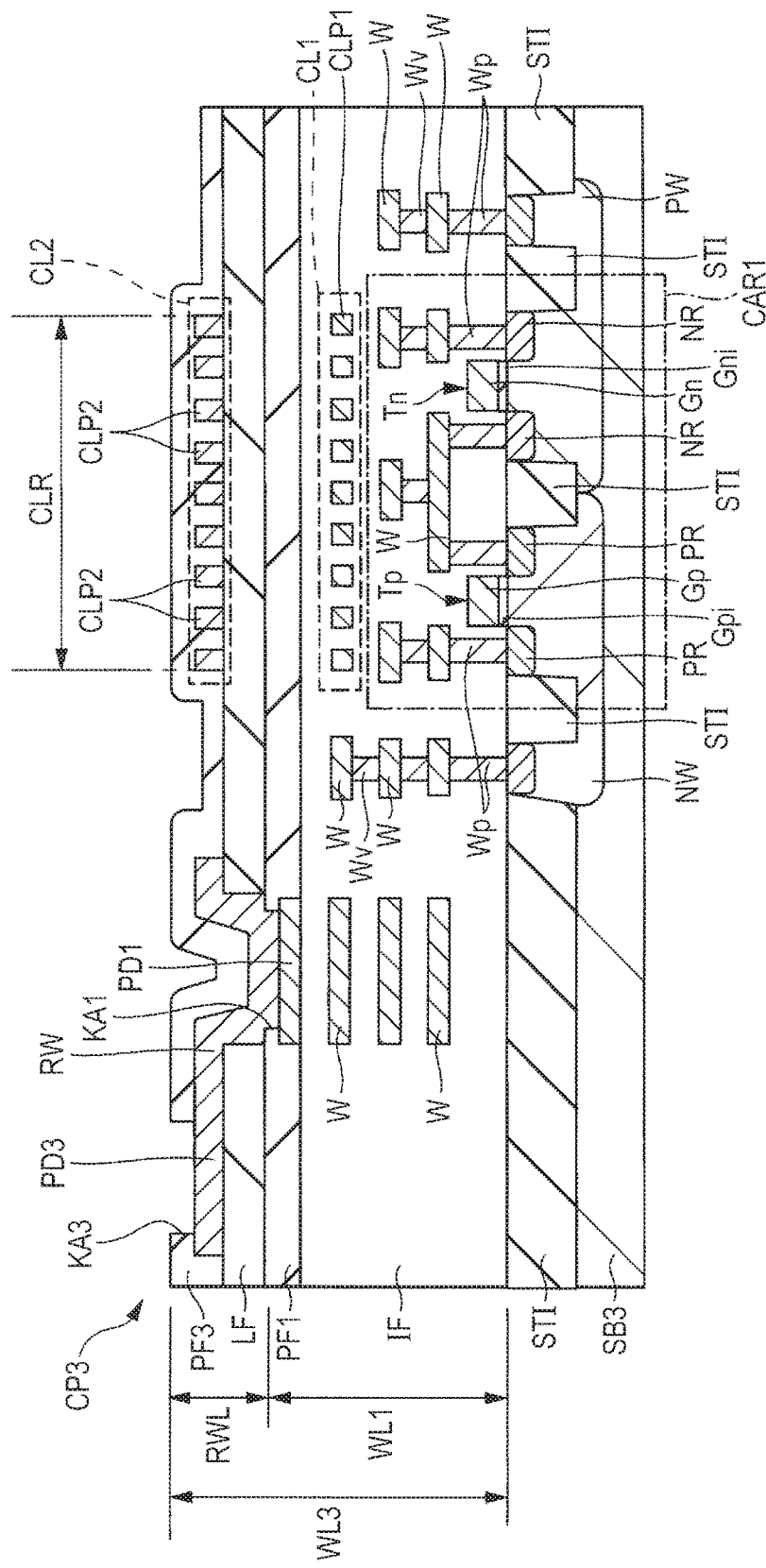

SEMICONDUCTOR DEVICE

CROSS-REFERENCE TO RELATED APPLICATIONS

The disclosure of Japanese Patent Application No. 2017-120798 filed on Jun. 20, 2017 including the specification, drawings and abstract is incorporated herein by reference in its entirety.

BACKGROUND

The present invention relates to semiconductor devices and more particularly to technology useful for semiconductor devices with an isolator to transmit signals between electrically insulated circuit blocks.

In connection with an isolator, Japanese Unexamined Patent Application Publication No. 2011-54800 discloses a technique that a first inductor of a first semiconductor chip and a second inductor of a second semiconductor chip are arranged in a manner to face each other and these two inductors are inductively coupled to transmit electric signals.

Also, Japanese Unexamined Patent Application Publication No. 2015-46622 discloses a structure in which a conductor pattern coupled to a power source or ground is arranged between a given signal line and a transistor region under the signal line in a manner to overlap the signal line in plan view.

SUMMARY

A semiconductor device with an isolator is demanded to be more compact.

The above and further objects and novel features of the invention will more fully appear from the following detailed description in this specification and the accompanying drawings.

According to one aspect of the present invention, there is provided a semiconductor device in which a first coil and a second coil formed in a first semiconductor chip and a second semiconductor chip respectively are arranged in a manner to face each other so as to be magnetically coupled during operation of the semiconductor device. The first coil is located in a manner to overlap part of the circuit region of the first semiconductor chip in plan view and the second coil is located in a manner to overlap part of the circuit region of the second semiconductor chip in plan view.

According to another aspect of the present invention, there is provided a semiconductor device in which a third coil and a fourth coil are arranged in a multilayer wiring layer of a semiconductor chip in a manner to face each other so as to be magnetically coupled during operation of the semiconductor device. The third coil and the fourth coil are located in a manner to overlap part of the circuit region of the semiconductor chip in plan view.

According to the present invention, a semiconductor device with a coil for an isolator can be compact.

BRIEF DESCRIPTION OF THE DRAWINGS

FIG. 27 is a schematic sectional view of a chip which configures the semiconductor device according to the second embodiment.

DETAILED DESCRIPTION

The preferred embodiments of the present invention will be described below in different sections or separately as necessary or for the sake of convenience, but the embodiments described as such are not irrelevant to each other unless otherwise stated. One embodiment may be, in whole or in part, a modified, detailed or supplementary form of another.

Furthermore, in the preferred embodiments described below, when numerical information for an element (the number of pieces, numerical value, quantity, range, etc.) is given by a specific number, it is not limited to the specific number unless otherwise stated or theoretically limited to the specific number. It may be larger or smaller than the specific number.

In the preferred embodiments described below, obviously, constituent elements (including constituent steps) are not necessarily essential unless otherwise stated or considered theoretically essential.

Similarly, in the preferred embodiments described below, when a specific form or positional relation is indicated for an element, it should be interpreted to include a form or positional relation which is substantially approximate or similar to the specific form or positional relation unless otherwise stated or theoretically limited to the specific form or positional relation. The same is true for the above numerical information and range.

In all the drawings that illustrate the preferred embodiments, basically the same members are designated by the same reference signs and description thereof is not repeated. For easy understanding, hatching may be used even in a plan view.

In description of the embodiments, "plan view" is a view of an object as it would be seen from a direction perpendicular to the main surface of a semiconductor substrate.

<Result of Research by the Inventors>

Figure 1:
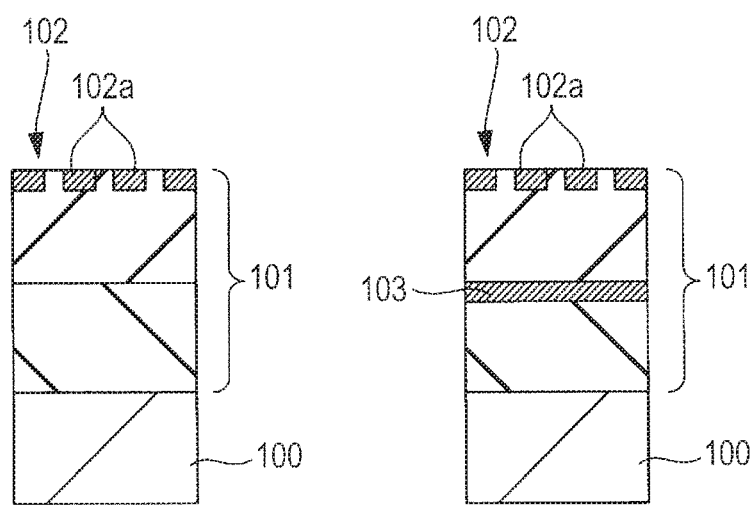
FIG. 1 (left and right) is a sectional view of a main part of a semiconductor device showing an example of a model to simulate the Q factor of a coil by a computer.

FIG. 1 (left) and FIG. 1 (right) are sectional views of a main part of a semiconductor substrate which show an example of a model to simulate the coil Q factor by a computer. In both FIG. 1 (left) and FIG. 1 (right), a multilayer wiring layer 101 is formed over a semiconductor substrate 100 and a conductor pattern 102a of a coil 102 is formed on the top of the multilayer wiring layer 101. While a wiring 103 is not provided just under the coil 102 in FIG. 1 (left), a wiring 103 is provided just under the coil 102 in FIG. 1 (right). The wiring 103 shown in FIG. 1 (right) is intended for use in an integrated circuit and formed in a manner to cover the entire area of the coil 102 in plan view (so-called solid wiring). The semiconductor substrate 100 is assumed to be made of monocrystalline silicon (Si).

Figure 2:
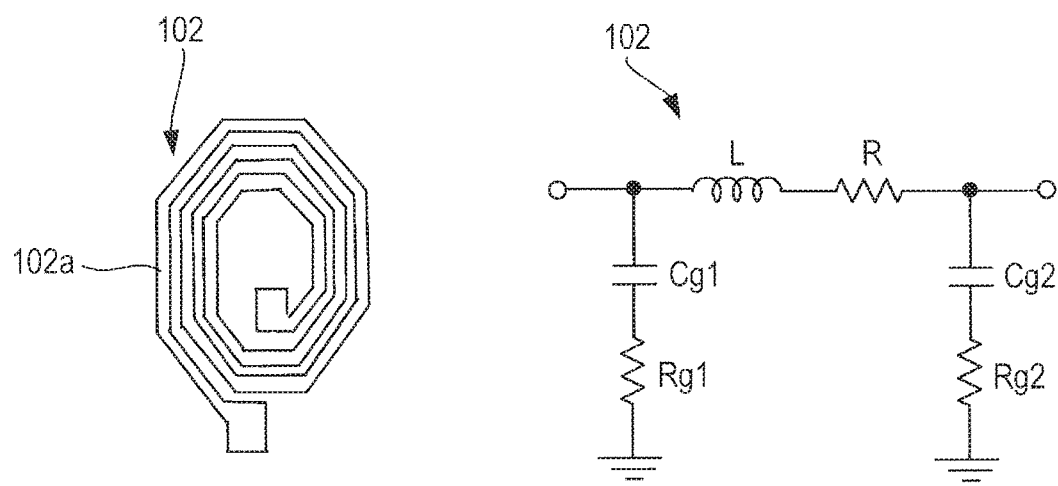
FIG. 2 (left) is a plan view which shows an example of the coil shown in FIG. 1, and FIG. 2 (right) is a circuit diagram which shows an equivalent circuit in activation of the coil shown in FIG. 2 (left)

FIG. 2 (left) is a plan view which shows an example of the coil shown in FIG. 1 (left) and FIG. 1 (right). The coil 102 is, for example, made of copper (Cu) wire. For example, the coil 102 has a line/space ratio of 10.9/8.1 μm, an inside diameter of 70 μm, a number of turns of 3, and a sheet resistance of 3.4 mΩ/square. FIG. 2 (right) is a circuit diagram which shows an equivalent circuit in activation of the coil shown in FIG. 2 (left). In the figure, sign L denotes inductance of the coil 102; sign R denotes serial resistance; signs Cg1 and Cg2 denote capacitance to substrate; and signs Rg1 and Rg2 denote resistance to substrate.

Figure 3:
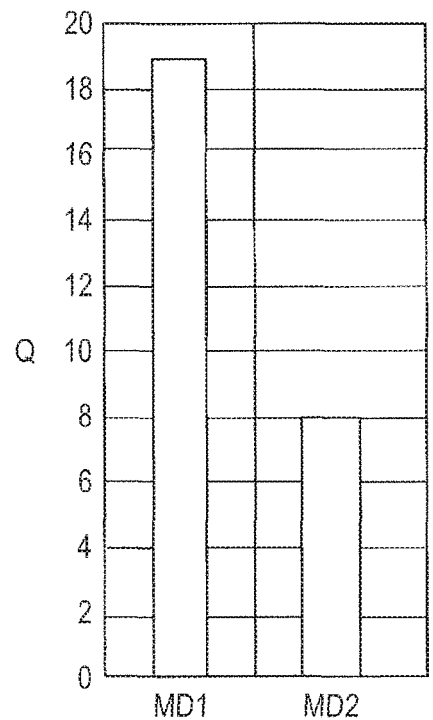
FIG. 3 is a graph which summarizes the result of simulation of Q factor of the coil shown in FIG. 1 (left) and FIG. 1 (right)

As for the characteristics of the coil 102, the Q factor (induced reactance (ωL)/resistance (R)) is an important parameter and to increase the Q factor is considered as important. For this reason, the inventors made a simulation of the Q factor of the coil 102 shown in FIG. 1 (left) and FIG. 1 (right). FIG. 3 is a graph which summarizes the result of simulation of the Q factor of the coil shown in FIG. 1 (left) and FIG. 1 (right). In FIG. 3, the vertical axis represents Q factor. The left model MD1 on the horizontal axis of FIG. 3 shows the result for the coil shown in FIG. 1 (left) (in the case that a wiring 103 is not provided). On the other hand, the right model MD2 on the horizontal axis of FIG. 3 shows the result for the coil in FIG. 1 (right) (in the case that a wiring 103 is provided), indicating that the Q factor of the coil 102 of the model MD2 is much lower than that of the left model MD1 in FIG. 3. The decrease in the Q factor of the coil 102 is attributable to an eddy current which is generated in the wiring 103 (solid wiring) by induced electromotive force generated in the wiring 103 under the coil 102 due to a magnetic field generated in the coil 102.

Figure 4:
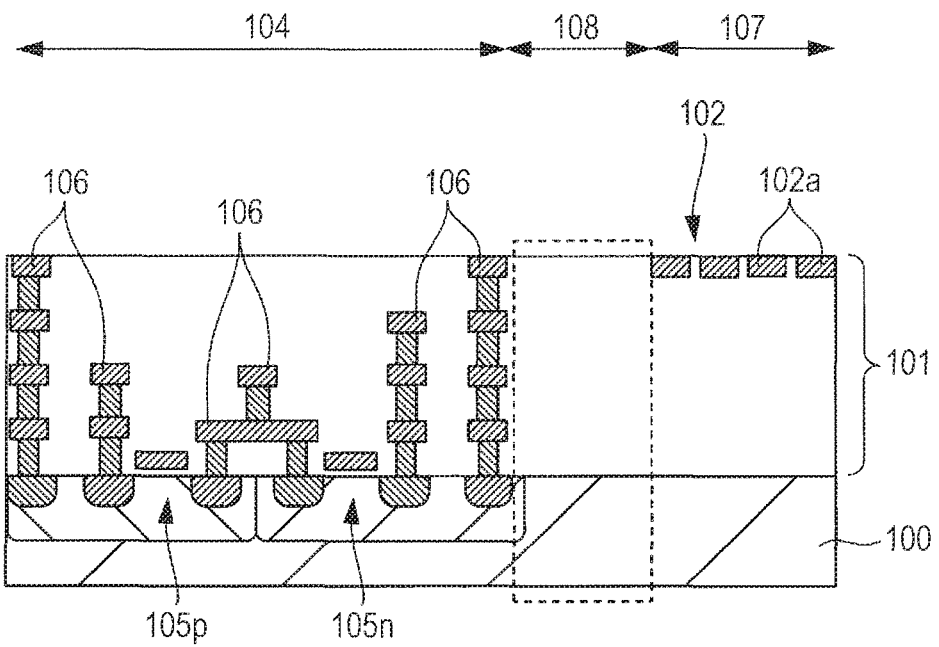
FIG. 4 is a sectional view of a main part of a semiconductor device which shows an example of a solution to the problem about coil Q factor.

FIG. 4 is a sectional view of a main part of a semiconductor device which shows an example of a solution to the problem about coil Q factor. In a circuit region 104 of the semiconductor device, for example, elements such as a p-channel field effect transistor 105p and an n-channel field effect transistor 105n are formed. These elements are electrically coupled by wirings 106 in the multilayer wiring layer 101 over the semiconductor substrate 100.

On the other hand, a coil 102 is formed in a coil region 107. The coil 102 is formed as a conductor pattern 102a for formation of wirings on the top of the multilayer wiring layer. In order to minimize the decrease in the Q factor of the coil 102, neither wiring nor element is provided just under the coil 102 and also a vacant region 108 is provided between the circuit region 104 and coil region 107. Neither wiring nor element is provided in the vacant region 108 as well. The horizontal distance of the vacant region 108 is, for example, 200 to 400 μm or so. Thus, in the solution shown in FIG. 4, the circuit region 104 and the coil region 107 are separated from each other, so the chip size should be larger. As a result, the cost of the semiconductor device is higher.

The present inventors restudied a semiconductor device with an isolator to couple two coils magnetically (inductive coupling) to transmit electric signals. As a result, it has been found that in the semiconductor device with such isolator, the two coils are located adjacent to each other (near field), so the circuit characteristics is affected not by the Q factor but by the factor of coupling K and the structure shown in FIG. 4 is not needed.

Figure 5:
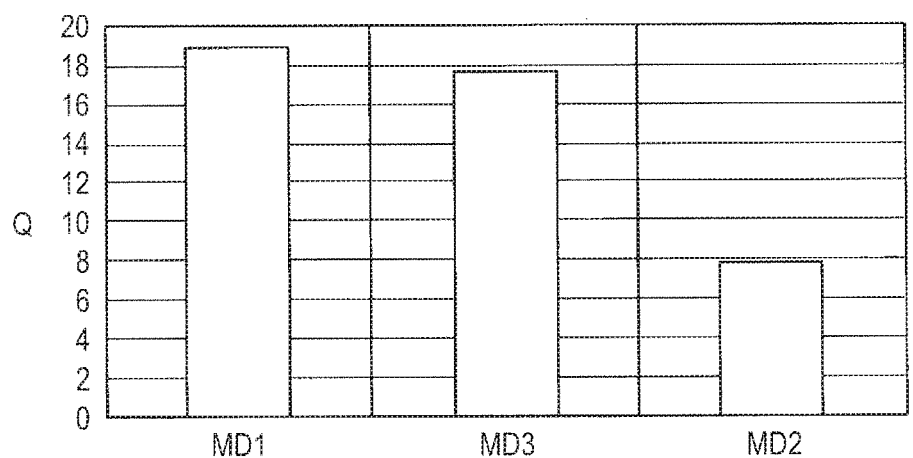
FIG. 5 is a graph which summarizes the result of simulation of the Q factor of a coil of a semiconductor device with an isolator.

With the growing tendency toward miniaturization of semiconductor device integrated circuits, wirings of integrated circuits are becoming thinner and thinner. Thus, it has been found that even when a wiring for an integrated circuit is located just under a coil, the influence on eddy currents is small. FIG. 5 is a graph which summarizes the result of simulation of the Q factor of a coil of a semiconductor device with an isolator. In FIG. 5, the leftmost model MD1 represents the result for the model in FIG. 1 (left) and the rightmost model MD2 represents the result for the model in FIG. 1 (right). The model MD3 in the center of FIG. 5 represents the result of simulation in the case that a wiring with a width of several micrometers to several tens of micrometers which simulates an actual integrated circuit wiring is located just under the coil. This figure suggests that when an actual integrated circuit wiring is located just under the coil, the decrease in the Q factor of the coil is small.

Figure 6:
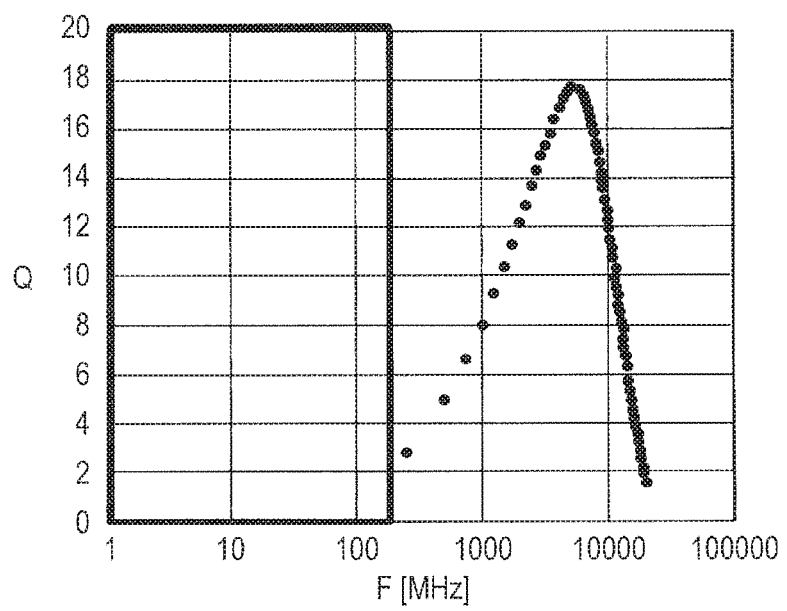
FIG. 6 is a graph which shows the result of simulation of coil Q factor versus operating frequency of a semiconductor device with an isolator.

In addition, the present inventors investigated the relation between the operating frequency of the semiconductor device with an isolator and the Q factor of the coil. FIG. 6 is a graph which shows the result of simulation of coil Q factor versus operating frequency of a semiconductor device with an isolator. The vertical axis represents coil Q factor and the horizontal axis represents operating frequency F (MHz). For the semiconductor device with an isolator, the operating frequency is between several tens of kilohertz and several hundreds of megahertz as indicated by the thick line frame in FIG. 6. From this figure, it is known that even when an element or wiring is provided just under the coil, the Q factor of the coil is never affected at the operating frequencies of the semiconductor device with an isolator. The reason is that the distance between the two coils is much smaller than the wavelength of a signal and thus the influence on the magnetic field generated between the two coils is very small.

First Embodiment

<Example of the Circuit Configuration>

Figure 7:
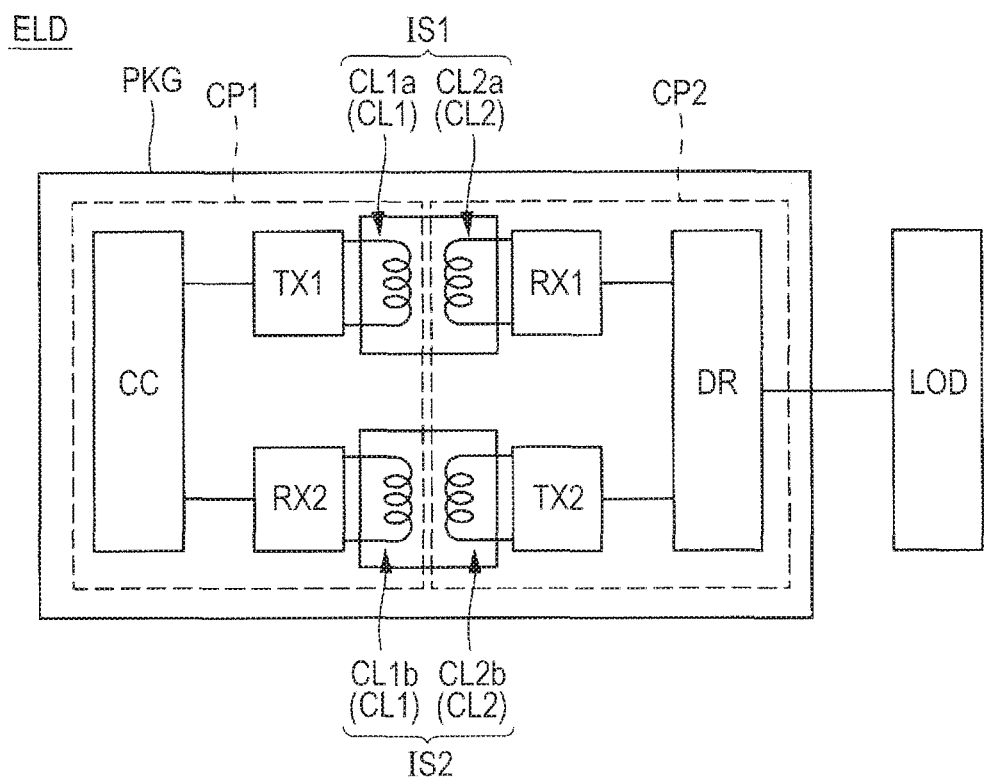
FIG. 7 is a circuit diagram which shows an example of an electronic device using a semiconductor device according to a first embodiment of the invention.

FIG. 7 is a circuit diagram which shows an example of an electronic device using a semiconductor device according to the first embodiment of the invention.

The electronic device ELD shown in FIG. 7 includes a package PKG and a load LOD. The package PKG houses two semiconductor chips (semiconductor devices) CP1 and CP2. Hereinafter, a semiconductor chip will be simply called "chip".

In one of the chips, CP1 (first semiconductor chip), a control circuit CC, transmitting circuit TX1, receiving circuit RX2, and coils CL1a and CL1b (CL1: first coils) are provided. In the other chip CP2 (second semiconductor chip), a receiving circuit RX1, transmitting circuit TX2, coils CL2a and CL2b (CL2: second coils), and drive circuit DR are provided.

The transmitting circuit TX1 and receiving circuit RX1 are circuits to transmit a control signal from the control circuit CC to the drive circuit DR. An isolator (insulating element, transformer, converter, magnetic coupling element, electromagnetic coupling element) IS1 is interposed between the transmitting circuit TX1 and receiving circuit RX1. The isolator IS1 has coils (inductors) CL1a and CL2a. The coil CL1a is electrically coupled to the transmitting circuit TX1 and the coil CL2a is electrically coupled to the receiving circuit RX1. These coils CL1a and CL2a are not coupled by a conductor but magnetically coupled (inductively coupled) when the electronic device ELD is operated. Specifically, as a signal is sent from the transmitting circuit TX1 to the coil CL1a (primary coil) and a current flows, an induced electromotive force is generated in the coil CL2a (secondary coil) according to the change in the current, causing an induced current to flow. Therefore, due to the induced current generated in the coil CL2a, the receiving circuit RX1 can receive a signal depending on the signal sent from the transmitting circuit TX1. Consequently, the transmitting circuit TX1 can send a signal to the receiving circuit RX1 through the isolator IS1 (namely, magnetically coupled coils CL1a and CL2a). Also, the receiving circuit RX1 can receive a signal from the transmitting circuit TX1 through the isolator IS1 (namely, magnetically coupled coils CL1a and CL2a). Thus, the control circuit CC can transmit a signal (control signal) to the drive circuit DR through the transmitting circuit TX1, isolator IS1, and receiving circuit RX1.

On the other hand, the transmitting circuit TX2 and receiving circuit RX2 are circuits to transmit a signal from the drive circuit DR to the control circuit CC. An isolator (insulating element, transformer, converter, magnetic coupling element, electromagnetic coupling element) IS2 is interposed between the transmitting circuit TX2 and receiving circuit RX2. The isolator IS2 has coils (inductors) CL1b and CL2b. The coil CL2b is electrically coupled to the transmitting circuit TX2 and the coil CL1b is electrically coupled to the receiving circuit RX2. These coils CL1b and CL2b are not coupled by a conductor but magnetically coupled (inductively coupled) when the electronic device ELD is operated. Specifically, as a signal is sent from the transmitting circuit TX2 to the coil CL2b (primary coil) and a current flows, an induced electromotive force is generated in the coil CL1b (secondary coil) according to the change in the current, causing an induced current to flow. Therefore, due to the induced current generated in the coil CL1b, the receiving circuit RX2 can receive a signal depending on the signal sent from the transmitting circuit TX2. Consequently, the transmitting circuit TX2 can send a signal to the receiving circuit RX2 through the isolator IS2 (namely, magnetically coupled coils CL1b and CL2b). Also, the receiving circuit RX2 can receive a signal from the transmitting circuit TX2 through the isolator IS2 (namely, magnetically coupled coils CL1b and CL2b). Thus, the drive circuit DR can transmit a signal to the control circuit CC through the transmitting circuit TX2, isolator IS2, and receiving circuit RX2.

The chip CP1 and chip CP2 are different in terms of voltage level (reference potential). For example, the chip CP1 is coupled to a low-voltage region with a circuit operating or driven at a low voltage (for example, several volts to several tens of volts) through bonding wires BW and leads LD, etc. which will be described later. The chip CP2 is coupled to a high-voltage region with a circuit operating or driven at a higher voltage than the low voltage (for example, 100 volts or more) (for example, the load LOD or a switch for the load LOD) through bonding wires BW and leads LD, etc. which will be described later. However, since transmission of signals between the chips CP1 and CP2 is done through the isolators IS1 and IS2, signals can be transmitted between circuits with different voltages.

In the isolators IS1 and IS2, a large potential difference may occur between the coils CL1a and CL2a or between the coils CL1b and CL2b. Conversely, because a large potential difference may occur, the coils CL1a and CL2a or the coils CL1b and CL2b are not coupled to each other by a conductor but magnetically coupled. For this reason, in order to improve the reliability of the package PKG incorporating the chips CP1 and CP2 or the electronic device ELD using the package, it is important to increase the dielectric voltage between the coils CL1a and CL2a and between the coils CL1b and CL2b as much as possible.

The operating frequency of the isolators IS1 and IS2 (namely the coils CL1 and CL2) is, for example, 200 MHz or less, specifically several tens of kilohertz to several hundreds of megahertz or less, more specifically, for example, 10 megahertz. Consequently, even if an element or wiring is arranged just under the coils CL1a, CL1b, CL2a, and CL2b, the Q factors of the coils CL1a, CL1b, CL2a, and CL2b are not affected.

The drive circuit DR in the package PKG is a circuit which drives the load LOD according to a signal sent from the chip CP1 to the chip CP2 (namely a signal sent from the transmitting circuit TX1 through the isolator IS1 to the receiving circuit RX1). For the drive circuit DR, many types of circuits are available and one example is a power circuit such as IGBT (Insulated Gate Bipolar Transistor). The load LOD is located outside the package PKG. For the load LOD, many types of loads are available depending on the application purpose and one example is a motor (electric motor mounted in an electric vehicle or hybrid vehicle, etc.).

Although FIG. 7 shows a case that the control circuit CC is built in the chip CP1, alternatively the control circuit CC can be built in a chip other than the chips CP1 and CP2.

Also, although FIG. 7 shows a case that the drive circuit DR is built in the chip CP2, alternatively the drive circuit DR can be built in a chip other than the chips CP1 and CP2.

<Example of Signal Transfer>

Figure 8:
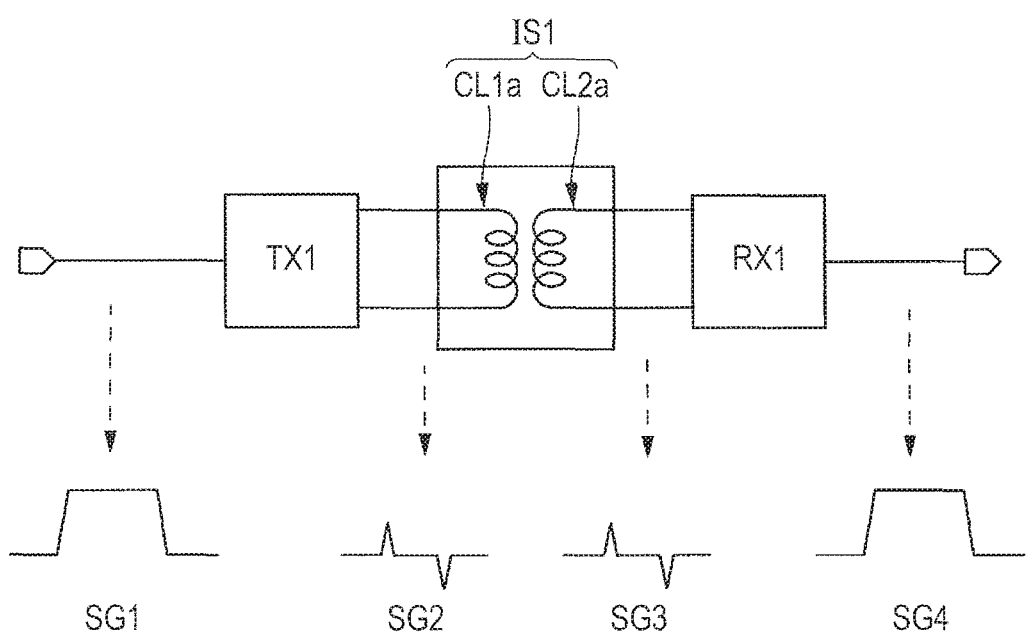
FIG. 8 is a diagram which explains an example of signal transfer.

FIG. 8 is a diagram which explains an example of signal transfer.

The transmitting circuit TX1 modulates the square-waveform signal SG1 entered into the transmitting circuit TX1, into a differential-waveform signal SG2 and sends the modulated signal SG2 to the coil CL1a (primary coil) of the isolator IS1. As the current of the differential-waveform signal SG2 flows in the coil CL1a (primary coil) of the isolator IS1, an induced electromotive force causes a signal SG3 depending on the current to flow in the coil CL2a (secondary coil) of the isolator IS1. The signal SG3 is amplified in the receiving circuit RX1 and modulated into a square-waveform signal, thereby causing the receiving circuit RX1 to output a square-waveform signal SG4. Thus, the signal SG4, which depends on the signal SG1 entered into the transmitting circuit TX1, is outputted from the receiving circuit RX1.

Transfer of a signal from the transmitting circuit TX2 to the receiving circuit RX2 is the same as above. FIG. 8 shows an example of signal transfer from the transmitting circuit TX1 to the receiving circuit RX1, but the way to transfer a signal is not limited thereto and a signal can be transferred in other various ways, provided that a signal is transferred through magnetically coupled coils (primary coil and secondary coil).

<Example of the Configuration of the Package>

Figure 9:
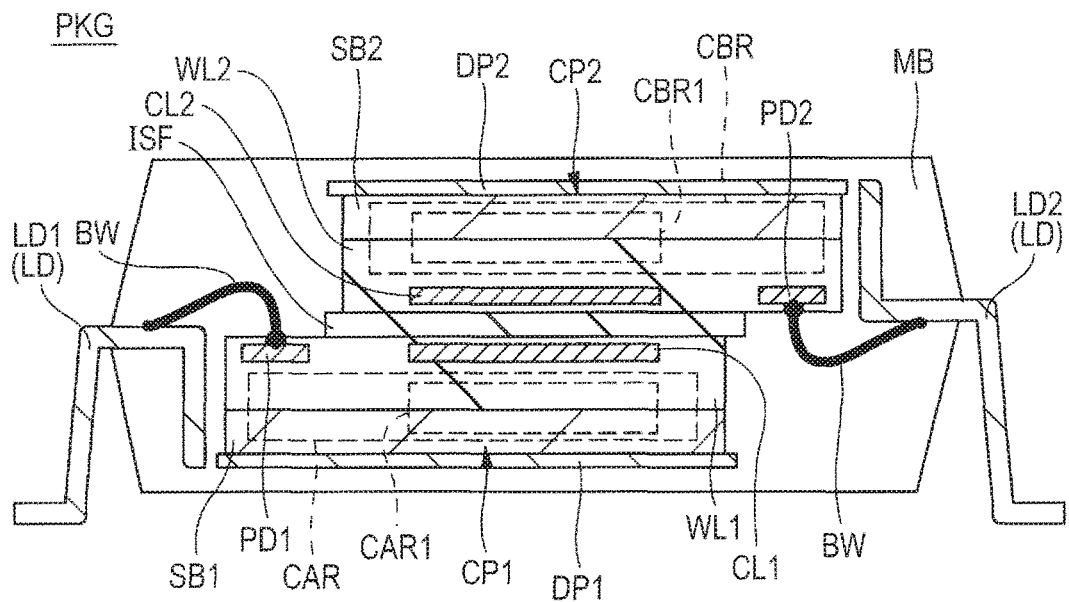
FIG. 9 is a sectional view of the semiconductor device according to the first embodiment.
Figure 10:
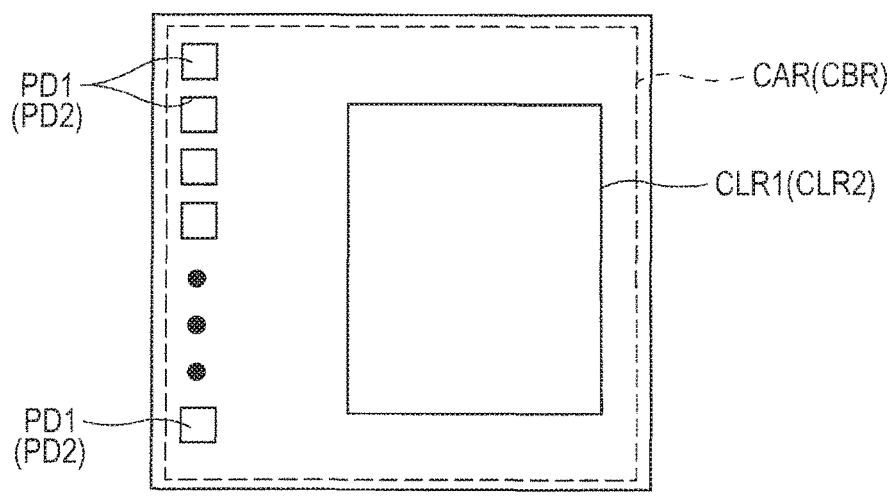
FIG. 10 is a plan view of a semiconductor chip in the semiconductor device shown in FIG. 9.
Figure 11:
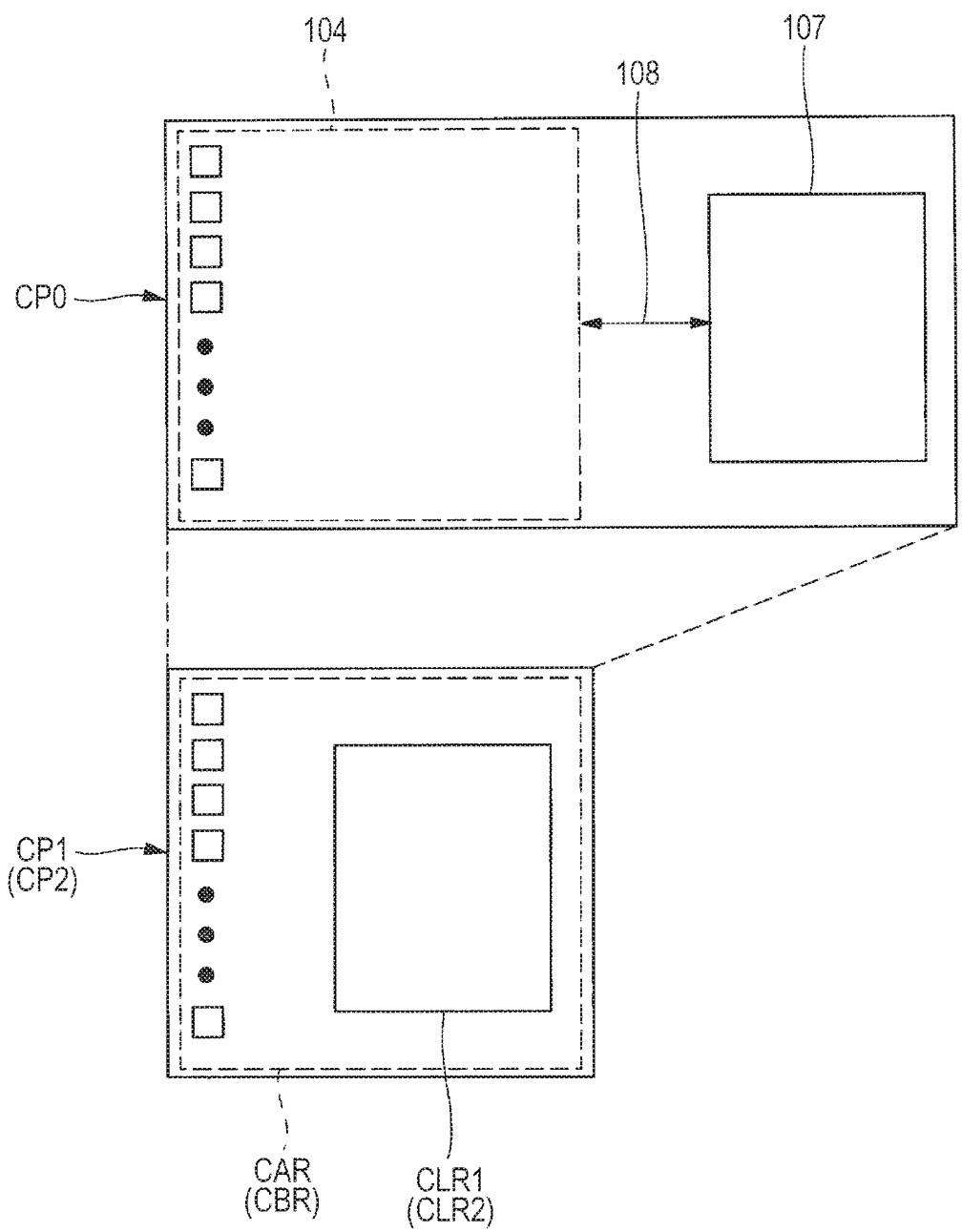
FIG. 11 is a plan view of the semiconductor chip in the first embodiment as compared with the case shown in FIG. 4.

Next, the semiconductor device (package PKG) according to the first embodiment will be described referring to FIGS. 9 to 11. FIG. 9 is a sectional view of the semiconductor device according to the first embodiment, FIG. 10 is a plan view of a chip in the semiconductor device shown in FIG. 9, and FIG. 11 is a plan view of a chip in this embodiment as compared with the case shown in FIG. 4. In FIG. 9, hatching for a sealing body MB is omitted for easy understanding of the illustration. In FIGS. 10 and 11, one chip represents the two chips designated by reference signs CP1 and CP2.

As shown in FIG. 9, the package PKG includes two chips CP1 and CP2, insulating film ISF, die pads DP1 and DP2, a plurality of leads LD (LD1, LD2), bonding wires (hereinafter simply called wires) BW, and sealing body MB.

The two chips CP1 and CP2 are housed in the sealing body MB through the insulating film ISF between the chips, in a manner to face each other (partially overlap each other in plan view). The sealing body MB is, for example, made of thermoset resin such as epoxy resin and the shape (external shape) of the plane perpendicular to the thickness direction of the sealing body MB is, for example, rectangular (quadrangular). The sealing body MB seals the chips CP1 and CP2, die pads DP1 and DP2, leads LD (LD1, LD2) and wires BW and protects these members electrically and mechanically. The sealing body MB may contain filler or the like.

The semiconductor substrate (first semiconductor substrate) SB1 of the lower chip CP1 in FIG. 9 has a main surface (first surface) as an element formation surface, and a back surface (second surface) opposite to the main surface. The chip CP1 is mounted over the die pad DP1 through a die bond (not shown) with the main surface of the semiconductor substrate SB1 up and the back surface of the semiconductor substrate SB1 facing the die pad DP1. The die pad DP1 is, for example, made of a metal material such as copper (Cu) or copper alloy.

A multilayer wiring layer (first multilayer wiring layer) WL1 is formed between the main surface of the semiconductor substrate SB1 of the chip CP1 and the insulating film ISF. In the multilayer wiring layer WL1, wirings to form an integrated circuit are formed. In the upper wiring layer of the multilayer wiring layer WL1 (in this example, the uppermost wiring layer nearest to the insulating film ISF), a plurality of bonding pads (hereinafter simply called "pads") PD1 (see FIGS. 9 and 10) and the coil CL1 (CL1a, CL1b) are formed.

Each pad PD1, which is an extracting electrode of the integrated circuit formed in the chip CP1, is electrically coupled to a lead LD1 through a wire BW. Specifically, one end of a wire BW is joined to the pad PD1 and the other end of the wire BW is joined to an inner lead portion of the lead LD1. The wire BW is a conductive coupling member (member for coupling), more specifically a conductive wire which is a metal thin wire, for example, made of gold (Au) or copper (Cu). The wires BW are sealed inside the sealing body MB and not exposed from the sealing body MB.

The leads LD are made of the same conductor as the die pad DP1 and preferably made of a metal material such as copper (Cu) or copper alloy. Each lead LD includes an inner lead portion located inside the sealing body MB and an outer lead portion located outside the sealing body MB. The space between the inner lead portions of neighboring leads LD is filled with the material of the sealing body MB. The outer lead portion of the lead LD functions as a terminal for external coupling of the package PKG (external terminal) and protrudes outward from the side face of the sealing body MB, forming a gull-wing shape.

The coil (first coil) CL1 is formed, for example, in the same wiring layer as the pads PD1 (in this example, the uppermost wiring layer). In the first embodiment, a portion (region CAR1) of a circuit region (first circuit region) CAR is arranged just under the coil CL1 as shown in FIG. 9. In other words, as shown in FIG. 10, the coil region CLR1 (coil CL1) is located in a manner to overlap a portion (region CAR1 in FIG. 9) of the circuit region CAR in plan view. Various circuits which configure the integrated circuit in the chip CP1, including the abovementioned control circuit CC, transmitting circuit TX1 or receiving circuit RX2 or other circuits such as the control circuits of the isolators IS1 and IS2, are arranged in the circuit region CAR and region CAR1. Due to this arrangement, as shown in FIG. 11, the size of the chip CP1 shown on the lower side in the first embodiment can be much smaller than the size of the chip CP0 shown on the upper side (in the case that the circuit region 104 is spaced from the coil region 107 as shown in FIG. 4). Therefore, the package PKG can also be smaller. The circuit in the region CAR1 will be described later.

On the other hand, the semiconductor substrate (second semiconductor substrate) SB2 of the upper chip CP2 shown in FIG. 9 has a main surface (third surface) as an element formation surface and a back surface (fourth surface) opposite to the main surface. The chip CP2 is mounted over the die pad DP2 through a die bond (not shown) with the main surface of the semiconductor substrate SB2 facing the main surface of the semiconductor substrate SB1 of the chip CP1 and the back surface of the semiconductor substrate SB2 facing the die pad DP2. The material of the die pad DP2 is the same as that of the die pad DP1.

A multilayer wiring layer (second multilayer wiring layer) WL2 is formed between the main surface of the semiconductor substrate SB2 of the chip CP2 and the insulating film ISF. In the multilayer wiring layer WL2, wirings to form an integrated circuit are formed. In the upper wiring layer of the multilayer wiring layer WL2 (in this example, the uppermost wiring layer nearest to the insulating film ISF), a plurality of pads PD2 (see FIGS. 9 and 10) and the coil CL2 (CL2a, CL2b) are formed.

Each pad PD2, which is an extracting electrode of the integrated circuit formed on the chip CP2, is electrically coupled to a lead LD2 through a wire BW. Specifically, one end of a wire BW is joined to the pad PD2 and the other end of the wire BW is joined to an inner lead portion of the lead LD2.

The material of the leads LD2 is the same as the material of the die pads DP1 and DP2. Like the leads LD1, each lead LD2 includes an inner lead portion and an outer lead portion. The space between the inner lead portions of neighboring leads LD2 is filled with the material of the sealing body MB. The outer lead portion of the lead LD2 functions as a terminal for external coupling of the package PKG (external terminal) and protrudes outward from the side face of the sealing body MB and is folded in the same direction as the lead LD1, forming a gull-wing shape.

The coil (second coil) CL2 is formed, for example, in the same wiring layer as the pads PD2 (in this example, the uppermost wiring layer). In the first embodiment, a portion (region CBR1) of a circuit region (second circuit region) CBR is arranged just under the coil CL2 (just above the coil CL2 in FIG. 9) as shown in FIG. 9. In other words, as shown in FIG. 10, the coil region CLR2 (coil CL2) is located in a manner to overlap a portion (region CBR1 in FIG. 9) of the circuit region CBR in plan view. Various circuits which configure the integrated circuit in the chip CP2, including the abovementioned transmitting circuit TX2 or receiving circuit RX1 or other circuits such as the control circuits of the isolators IS1 and IS2, are arranged in the circuit region CBR and region CBR1. Due to this arrangement, as shown in FIG. 11, the size of the chip CP2 shown on the lower side in the first embodiment can be much smaller than the size of the chip CP0 shown on the upper side (in the case that the circuit region 104 is spaced from the coil region 107 as shown in FIG. 4). Therefore, the package PKG can also be smaller. The circuit in the region CBR1 will be described later.

In the first embodiment, the size of the chips CP1 and CP2 can be decreased as mentioned above and thus the semiconductor device can be compact. Therefore, the cost of the semiconductor device can be reduced.

<Example of the Chip Configuration>

Figure 12:
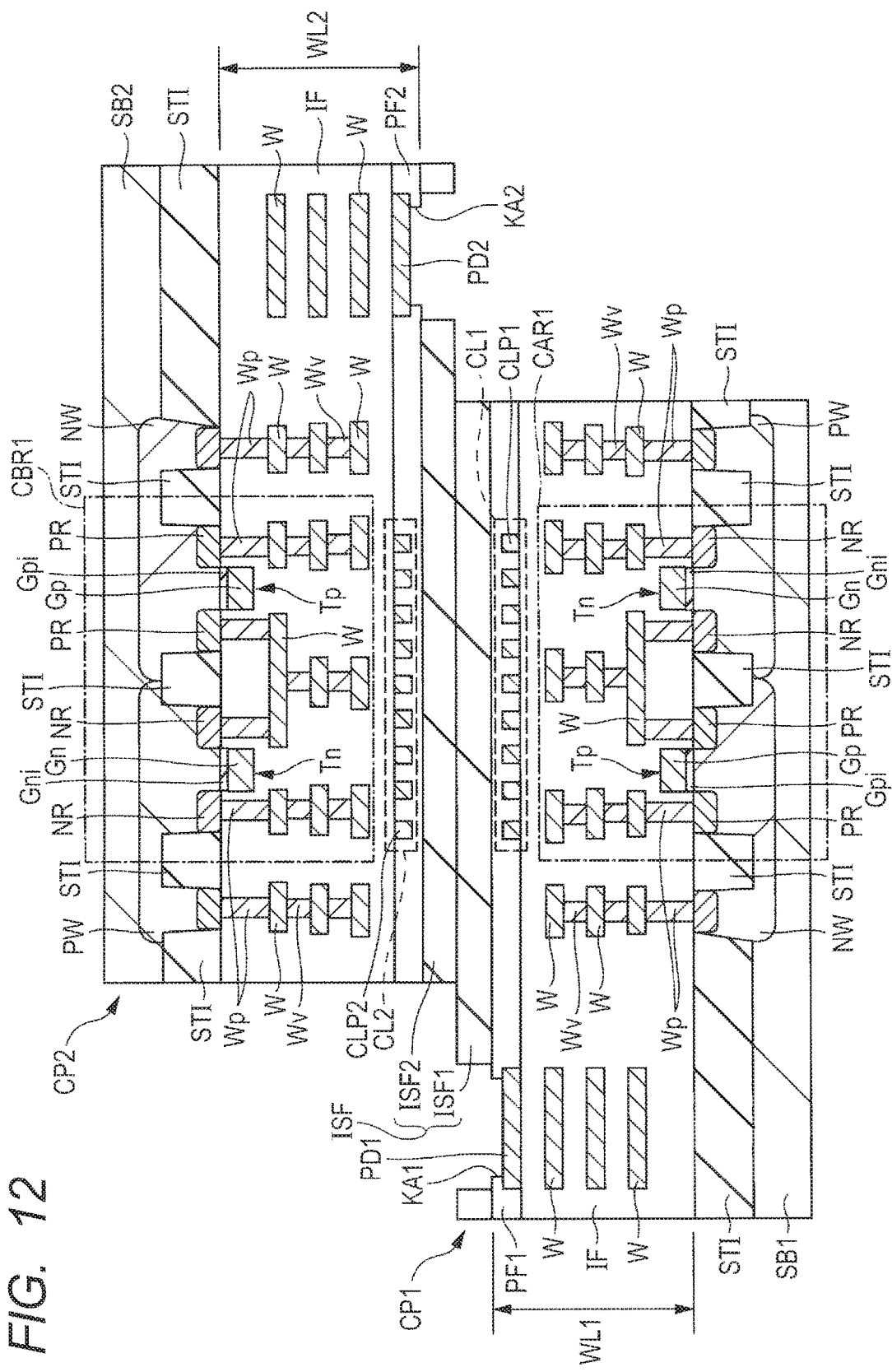
FIG. 12 is a schematic sectional view of the two chips of the semiconductor device.
Figure 13:
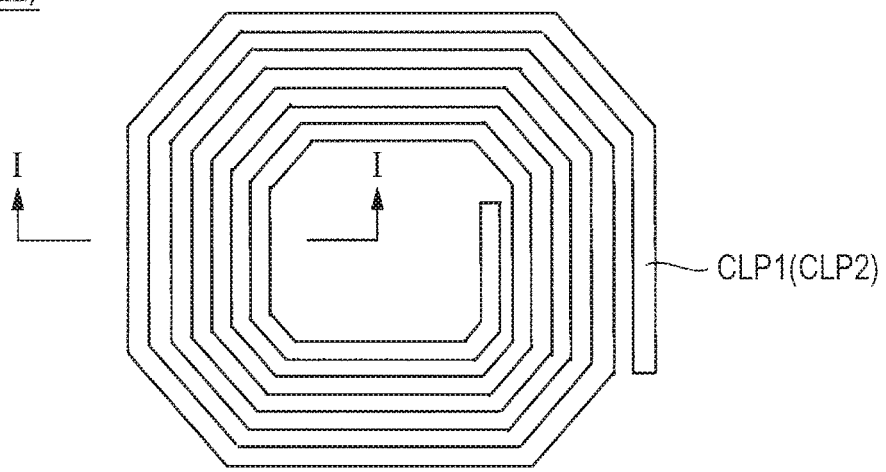
FIG. 13 is a plan view which shows an example of a coil.
Figure 14:
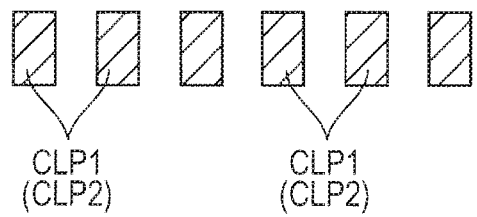
FIG. 14 a sectional view taken along the line I-I of FIG. 13.

Next, an example of the configuration of the chips CP1 and CP2 will be explained referring to FIGS. 12 to 14. FIG. 12 is a schematic sectional view of the two chips of the semiconductor device, FIG. 13 is a plan view which shows an example of a coil, and FIG. 14 is a sectional view taken along the line I-I of FIG. 13. In FIG. 12, hatching for the insulating layers of the multilayer wiring layers WL1 and WL2 is omitted for easy understanding of the illustration. FIG. 12 shows one of the pairs of coils CL1 and CL2 shown in FIG. 7.

As shown in FIG. 12, the semiconductor substrates SB1 and SB2 are, for example, made of p-type monocrystalline silicon (Si) and for example, a trench type isolation STI is made in the main surface of each of the substrates. In this example, the semiconductor substrate is assumed to be made of monocrystalline silicon, but alternatively the semiconductor substrate may be an SOI (Silicon On Insulator) substrate or a silicon carbide (SiC) substrate or the like.

In the active region surrounded by the isolation STI in the main surface of each of the semiconductor substrates SB1 and SB2, integrated circuit elements such as a p-channel field effect transistor Tp and n-channel field effect transistor Tn are formed. Although integrated circuit elements here are exemplified by field effect transistors, the integrated circuit elements may be a capacitative element, resistor element, and memory device or another type of transistor.

The p-channel field effect transistor Tp includes a gate electrode Gp, gate insulating film Gpi, and p-type semiconductor regions PR, PR for a source and a drain. The n-channel field effect transistor Tn includes a gate electrode Gn, gate insulating film Gni, and n-type semiconductor regions NR, NR for a source and a drain.

The gate electrodes Gp and Gn are, for example, made of low-resistance polycrystalline silicon film. The gate insulating films Gpi and Gni are, for example, made of silicon oxide film. A p-type semiconductor region PR is formed by implanting impurities such as boron into the n-well NW of each of the semiconductor substrates SB1 and SB2. An n-type semiconductor region NR is formed by implanting impurities such as phosphorus or arsenic into the p-well PW of each of the semiconductor substrates SB1 and SB2.

The multilayer wiring layers WL1 and WL2 each have four wiring layers. Specifically, in the multilayer wiring layers WL1 and WL2, wiring layers and insulating layers are alternately stacked along the thickness direction of the semiconductor substrates SB1 and SB2. Wirings W are arranged in a plurality of wiring layers in the multilayer wiring layers WL1 and WL2. The width of each wiring W is several micrometers to several tens of micrometers or so (for example, 10 to 20 micrometers for wirings nearest to the coils CL1 and CL2).

Plugs Wp are provided between wirings W in the first wiring layer and the semiconductor substrate SB1 (SB2) and between wirings W in the first wiring layer and the gate electrodes Gp and Gn. A plug Wp is a wiring member which electrically couples a wiring W in the first wiring layer and the semiconductor region NR or PR, etc. of the semiconductor substrate SB1 (SB2) and electrically couples a wiring W in the first wiring layer and the gate electrode Gp or Gn, etc. The plug Wp is, for example, made of a metal material such as tungsten. Furthermore, vias Wv are provided between other wiring layers. A via Wv is a wiring member which electrically couples wirings W, W between different wiring layers. The via Wv is, for example, made of a metal material such as aluminum or copper. The via Wv may be formed from part of a wiring W in a wiring layer above the via Wv.

These wirings W, plugs Wp, and vias Wv are used to electrically couple the integrated circuit elements such as the field effect transistors Tp and Tn to each other to form various circuits as mentioned above. The insulating film IF of the insulating layer in each of the multilayer wiring layers WL1 and WL2 is, for example, made of silicon oxide. In this example, the number of wiring layers in the multilayer wiring layers WL1 and WL2 is assumed to be 4, but the number of wiring layers is not limited to 4 and may be varied. However, preferably at least three wiring layers should be provided. When three or more wiring layers are provided, the coils CL1 and CL2 and wirings W can be easily arranged.

The coils CL1 and CL2 are formed in the uppermost wiring layers of the multilayer wiring layers WL1 and WL2, respectively. Conductor patterns CLP1 and CLP2 which configure the coils CL1 and CL2 are formed, for example, at the same time as the pads PD1 and PD2, respectively. Therefore, the conductor patterns CLP1 and CLP2 of the coils CL1 and CL2 are formed from the same conductor as the pads PD1 and PD2, respectively and preferably the conductor should be made of a metal material such as aluminum (Al) or copper.

The pads PD1 (PD2) and coil CL1 (CL2) are covered by a surface protective film PF1 (PF2) lying over the insulating film IF. The surface protective film PF1 (PF2) has a laminated structure in which a silicon oxide film and a silicon nitride film are stacked from below sequentially. An opening KA1 (KA2) which partially exposes the pads PD1 (PD2) is made in part of the surface protective film PF1 (PF2). One end of the wire BW is joined to a pad PD1 (PD2) through the opening KA1 (KA2).

The insulating film ISF has, for example, an insulating film ISF1 attached to the multilayer wiring layer WL1 of the semiconductor substrate SB1 and an insulating film ISF2 attached to the multilayer wiring layer WL2 of the semiconductor substrate SB2. The insulating films ISF1 and ISF2 are joined to each other through contact portions of the insulating films ISF1 and ISF2. The insulating films ISF1 and ISF2 are, for example, made of a resin material such as polyimide and the thickness of the film lamination is, for example, several tens of micrometers to several hundreds of micrometers. The material and thickness of the insulating film ISF ensure the required dielectric voltage between the coils CL1 and CL2. In this example, the insulating film ISF includes two insulating films ISF1 and ISF2. Instead, however, the insulating film ISF may be a single insulating film.

The coils CL1 and CL2 are, for example, spiral in plan view as shown in FIG. 13. When the coils CL1 and CL2 face each other, the winding direction of the coil CL1 is the same as that of the coil CL2. In addition, the coils CL1 and CL2 are arranged so that the conductor pattern CLP1 of the coil CL1 and the conductor pattern CLP2 of the coil CL2 overlap each other in plan view.

The surface protective films PF1 and PF2 and the laminated insulating film (first insulating film) including the insulating films ISF1 and ISF2 lie between the coils CL1 and CL2, so the coils CL1 and CL2 are insulated from each other, but magnetically coupled when the isolators IS1 and IS2 are operated. The distance between the coils CL1 and CL2 is, for example, 5 to 20 micrometers or so. The diameter of the coils CL1 and CL2 is, for example, 100 to 500 micrometers. The number of turns of the coils CL1 and CL2 is, for example, 11 to 21 (specifically, for example, 15). The conductor width (size in the short direction) of the conductor pattern CLP1 (CLP2) of the coil CL1 (CL2) is, for example, several micrometers or so. The pitch between adjacent turns of the conductor pattern CLP1 (CLP2) of the coil CL1 (CL2) is, for example, several micrometers to several tens of micrometers or so.

<Example of the Circuit which Overlaps the Coil Region in Plan View>

Next, the circuit which is located in a manner to overlap the coil region CLR1 or CLR2 (coil CL1 or CL2) in plan view will be described referring to FIGS. 9, 10, 15, and 16.

As shown in FIGS. 9 and 10, preferably the circuit to be located in the region CAR1 or CBR1 which overlaps the coil region CLR1 (coil CL1) or CLR2 (coil CL2) in plan view is, for example, a digital circuit (whole or part of an aggregate of integrated circuit elements and wirings W which configure a digital circuit). The reason is that in the case of a digital circuit, a certain degree of variation in signal level is negligible.

Nevertheless, if the electronic device ELD does not require high accuracy, an analog circuit with a relatively low sensitivity or the like may be arranged in the region CAR1 (CBR1) which overlaps the coil region CLR1 (CLR2) in plan view. If that is the case, an analog circuit with a relatively high sensitivity or the like is arranged in an area which does not overlap the coil region CLR1 (CLR2) in plan view. On the other hand, if the electronic device ELD requires high accuracy, preferably an analog circuit with a low sensitivity should be arranged in an area which does not overlap the coil region CLR1 (CLR2) in plan view, like an analog circuit with a high sensitivity.

Figure 15:
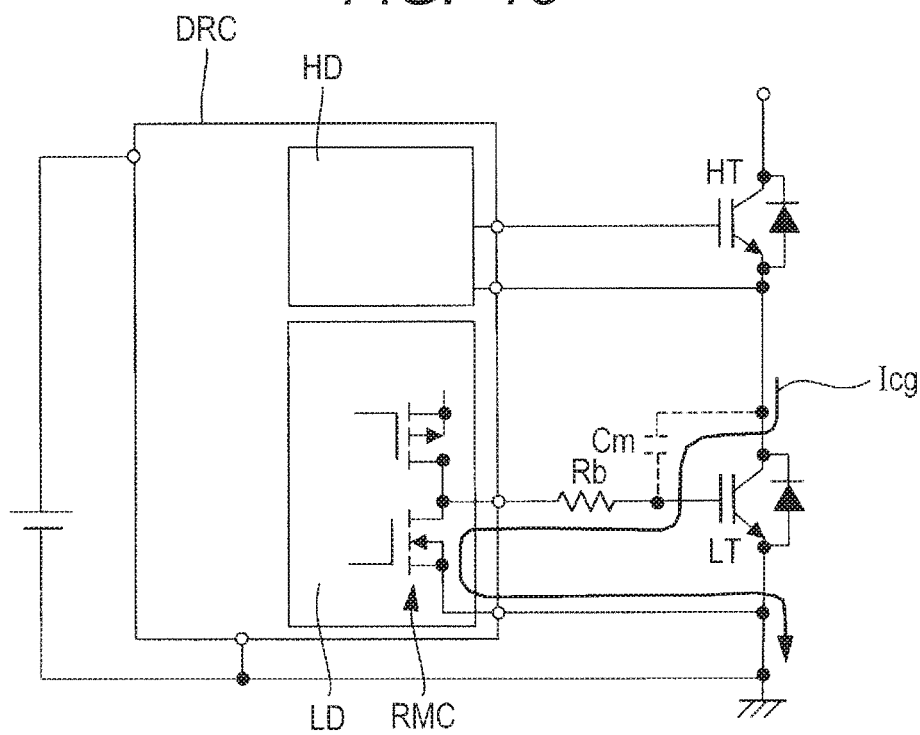
FIG. 15 is a circuit diagram which shows an example of an analog circuit which can be located in a region overlapping a coil region in plan view.
Figure 16:
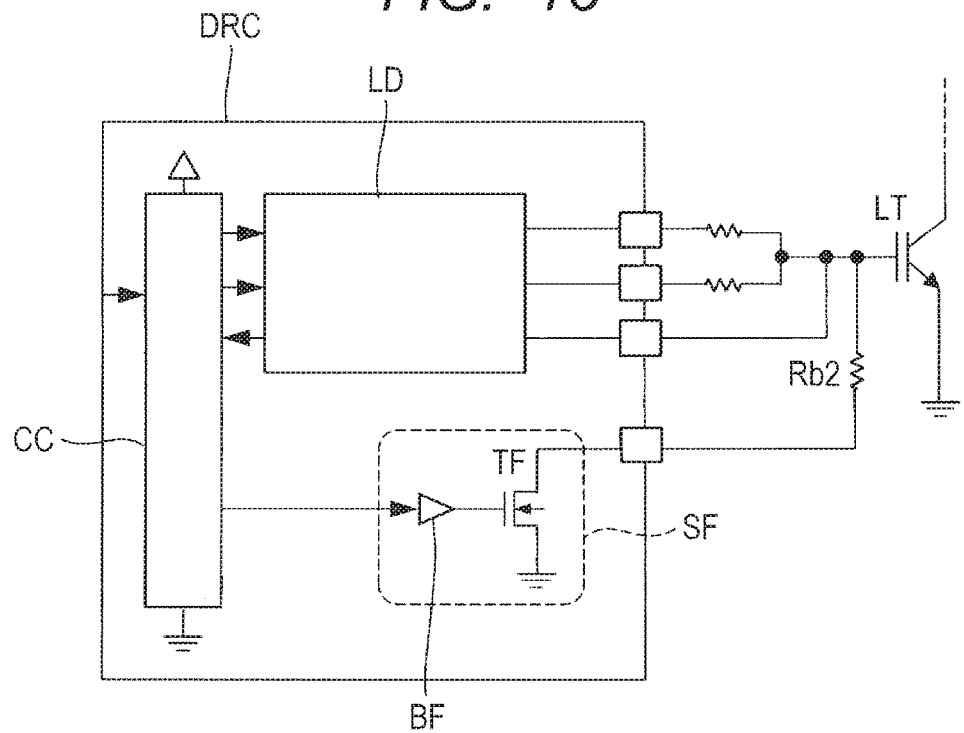
FIG. 16 is a circuit diagram which shows another example of an analog circuit which can be located in a region overlapping a coil region in plan view.

FIGS. 15 and 16 show examples of an analog circuit which can be arranged in the region CAR1 (CBR1) overlapping the coil region CLR1 (CLR2) in plan view.

FIG. 15 shows an example of a driver circuit DRC in which an active mirror clamp circuit is built. The driver circuit DRC is a circuit which drives a high-side transistor HT and a low-side transistor LT series-coupled with it. The transistors HT and LT are, for example, IGBTs. The driver circuit DRC includes a high-side drive circuit HD and a low-side drive circuit LD and also includes an active mirror clamp circuit MC. The active mirror clamp circuit MC is a circuit which prevents the self turn-on phenomenon of the low-side transistor LT due to capacitive coupling between the gate and collector of the low-side transistor LT or a similar reason. More specifically, when the high-side transistor HT turns on, the emitter potential of the high-side transistor HT and the collector potential of the low-side transistor LT rise and dv/dt is applied. At this time, current Icg flows in through the parasitic capacitance (mirror capacitance Cm) between the collector and gate of the low-side transistor LT and the gate resistance Rb, thereby causing the gate potential of the low-side transistor LT to rise; if the threshold voltage of the transistor LT is exceeded, the high-side/low-side transistor HT/LT is arm short-circuited. As a solution to this problem, in the active mirror clamp circuit MC, current Icg which flows in the mirror capacitance Cm is bypassed to the emitter of the low-side transistor LT to suppress the rise in the gate potential of the transistor LT. This active mirror clamp circuit MC can be arranged in a manner to overlap the coil region CLR1 (CLR2) in plan view. In short, the active mirror clamp circuit MC can be wholly or partially located in the region CAR1 (CBR1) of the circuit region CAR (CBR).

FIG. 16 shows an example of a driver circuit with a soft turn-off circuit. FIG. 16 shows part of the driver circuit DRC shown in FIG. 15. IGBT requires protection within a short time and turn-off time of IGBT is very quick and thus if a usual drive signal is used to shut off overcurrent, the collector voltage might rise largely and cause the overcurrent to break down the IGBT. The soft turn-off circuit SF is a circuit which slowly lowers the gate voltage of the IGBT (low-side transistor LT) to turn off when an abnormality such as overcurrent is detected. Here, the soft turn-off circuit SF has a buffer circuit BF and a field effect transistor TF. Input of the buffer circuit BF is electrically coupled to the control circuit CC. Output of the buffer circuit BF is coupled to the gate electrode of the field effect transistor TF. Output of the field effect transistor TF is electrically coupled to the gate electrode of the low-side transistor LT through a resistance Rb2. This soft turn-off circuit SF can be located in a manner to overlap the coil region CLR1 (CLR2) in plan view. In short, the soft turn-off circuit SF can be wholly or partially located in the region CAR1 (CBR1) of the circuit region CAR (CBR).

<Example of the Semiconductor Device Manufacturing Method>

Next, an example of the semiconductor device manufacturing method according to the first embodiment will be described referring to FIGS. 17 to 20. FIGS. 17 to 20 are sectional views of a main part in the process of manufacturing a chip which configures a semiconductor device. The same manufacturing method is used for the chips CP1 and CP2, so the manufacturing method for the chips is explained below, by taking the chip CP1 as an example. Here, the semiconductor substrate SB1 is a semiconductor wafer which is virtually circular in plan view.

Figure 17:
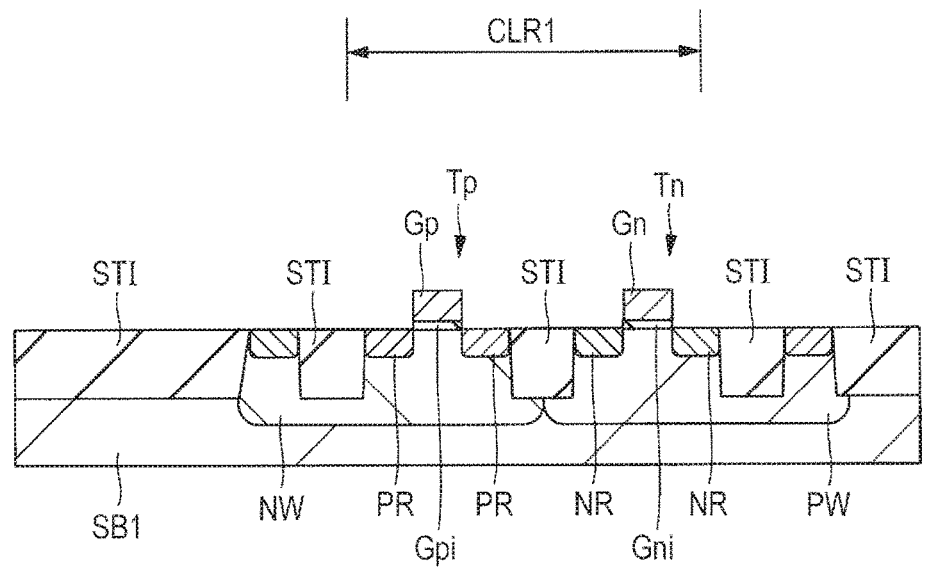
FIG. 17 is a sectional view of a main part of a semiconductor chip of a semiconductor device under manufacture at a manufacturing step.

First, as shown in FIG. 17, an n-well NW and a p-well PW are formed over the main surface of a semiconductor substrate SB1 made of p-type monocrystalline silicon (Si). The n-well NW is formed, for example, by implanting phosphorous or arsenic ions into the semiconductor substrate SB1 using an ion implantation technique, etc. The p-well PW is formed, for example, by implanting boron ions into the semiconductor substrate SB1 using an ion implantation technique, etc.

Next, a trench type isolation STI is made in the main surface of the semiconductor substrate SB1. Then, in the active region surrounded by the trench type isolation STI, integrated circuit elements such as a p-channel field effect transistor Tp and n-channel field effect transistor Tn are formed. In the first embodiment, integrated circuit elements such as field effect transistors Tp and Tn are also formed in the area which overlaps the coil region CLR1 in plan view.

Figure 18:
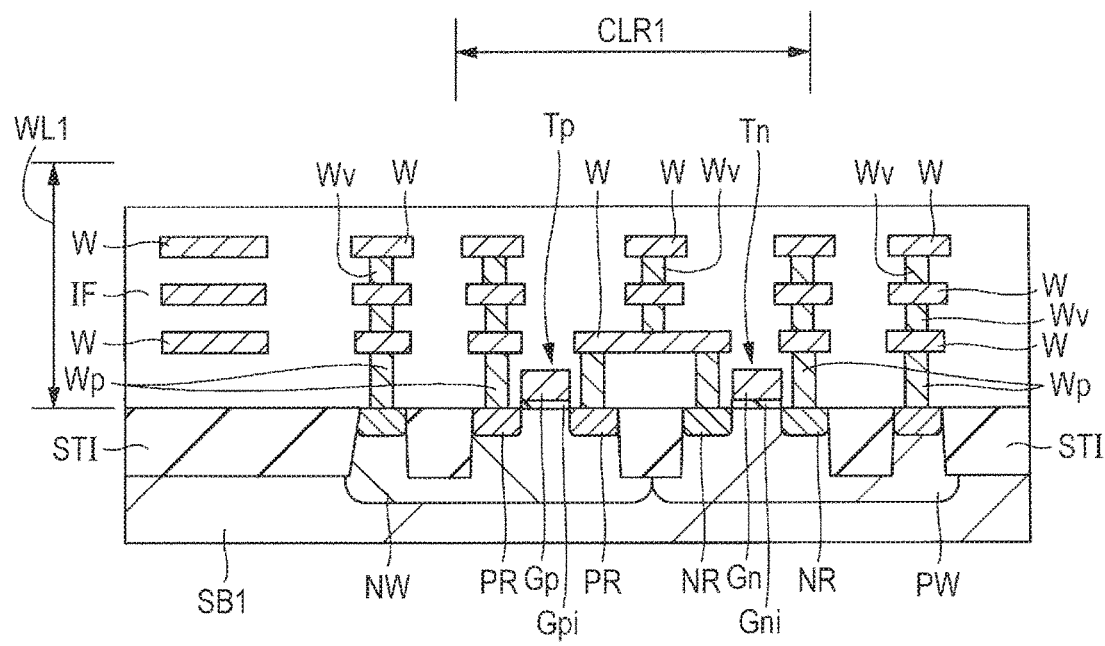
FIG. 18 is a sectional view of the main part of the semiconductor chip of the semiconductor device under manufacture at a manufacturing step following the step shown in FIG. 17.

Next, as shown in FIG. 18, a multilayer wiring layer WL1 is formed over the main surface of the semiconductor substrate SB1. FIG. 18 shows that wiring layers up to the wiring layer one level lower than the uppermost wiring layer have been formed. In the first embodiment, wirings W are also formed in the area which overlaps the coil region CLR1 in plan view.

Figure 19:
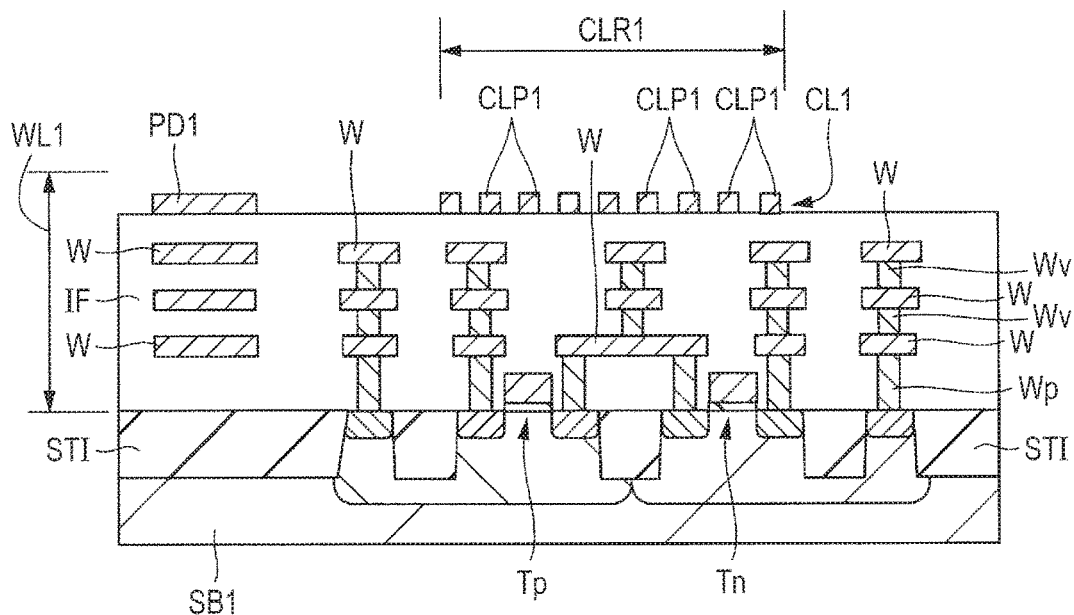
FIG. 19 is a sectional view of the main part of the semiconductor chip of the semiconductor device under manufacture at a manufacturing step following the step shown in FIG. 18.

Next, a conductor film such as an aluminum film is deposited over the uppermost wiring layer of the multilayer wiring layer WL1 using a sputtering technique, etc. and then patterning is done on the conductor film using a lithographic technique or etching technique. Consequently, as shown in FIG. 19, pads PD1 are formed and a coil CL1 (conductor pattern CLP1) is formed in the coil region CLR1. Alternatively, the wirings W and coil CL1 can also be formed by a damascene method. In other words, the wirings W and coil CL1 can also be formed by burying conductor film in the trench made in the insulating film.

Figure 20:
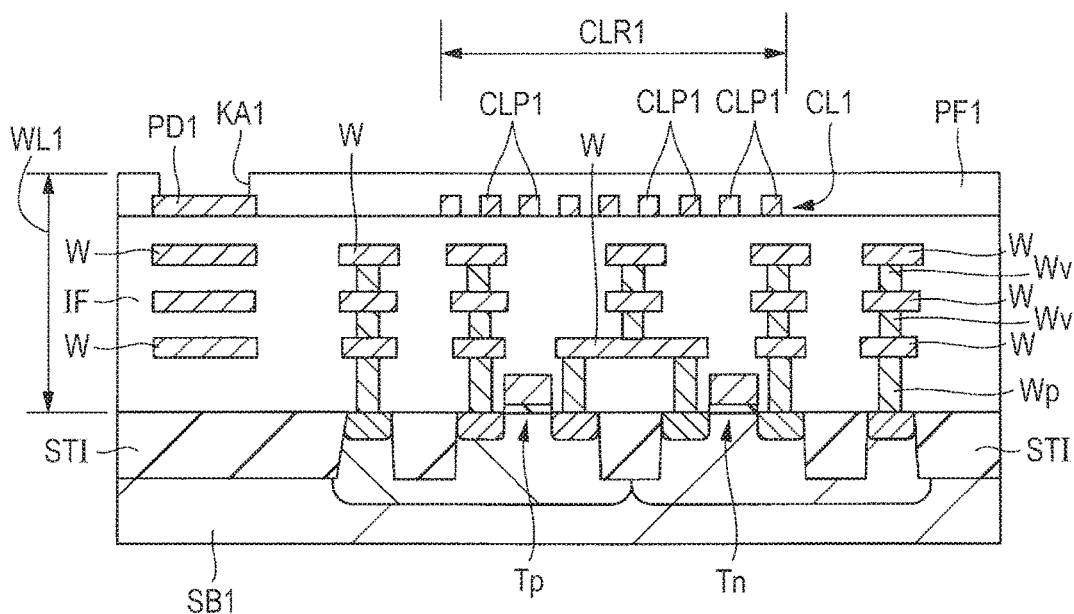
FIG. 20 is a sectional view of the main part of the semiconductor chip of the semiconductor device under manufacture at a manufacturing step following the step shown in FIG. 19.

Then, as shown in FIG. 20, a surface protective film PF1 is deposited over the uppermost layer of the multilayer wiring layer WL1 in a manner to cover the pads PD1 and the coil CL1. The surface protective film PF1 is formed by stacking a silicon oxide film and a silicon nitride film sequentially from below. Then, an opening KA1 which partially exposes the pads PD1, etc. is made in the surface protective film PF1.

<Variation 1 of the First Embodiment>

Figure 21:
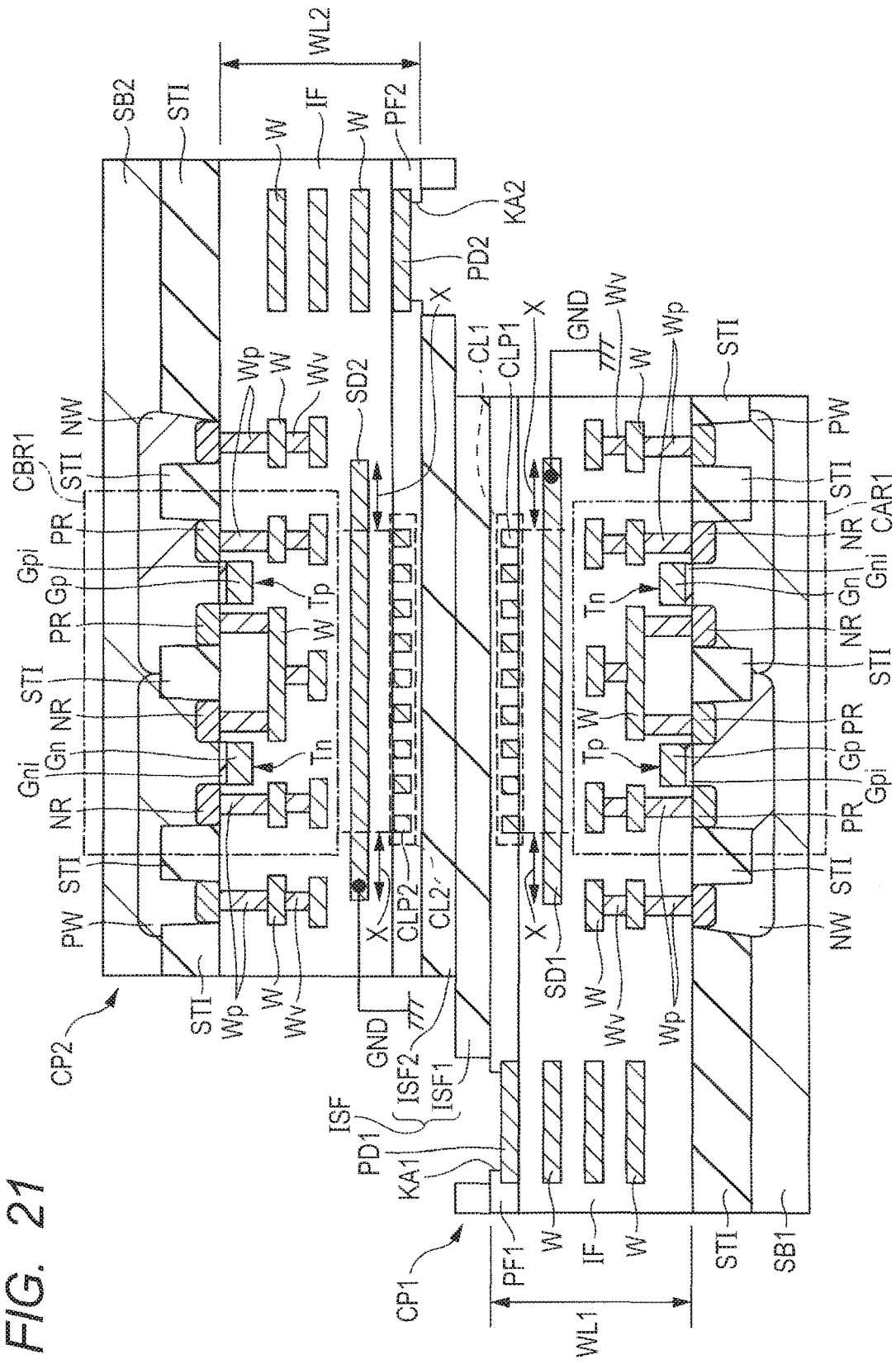
FIG. 21 is a schematic sectional view of two chips which configure a semiconductor device according to Variation 1.

Next, an example of the chips CP1 and CP2 according to Variation 1 of the first embodiment will be described referring to FIG. 21. FIG. 21 is a schematic sectional view of two chips which configure a semiconductor device according to Variation 1. In FIG. 21, a sealing body MB, leads LD, and wires BW are omitted as in FIG. 12 and these constituent elements are the same as those in the first embodiment shown in FIG. 9.

In Variation 1, in the chip CP1 (CP2), a shield pattern SD1 or first shield pattern (SD2 or second shield pattern) is arranged in the wiring layer just under (one level lower than) the uppermost wiring layer in which the coil CL1 (CL2) is located. The shield pattern SD1 (SD2) is made of the same material and at the same formation step as wirings W in the same wiring layer. The shield pattern SD1 (SD2) is, for example, a solid pattern which covers the coil CL1 (CL2) in plan view, respectively. The shield pattern SD1 (SD2) decreases the parasitic capacitance between the coil CL1 (CL2) and the wirings W in the wiring layer just under the coil, so the circuit characteristics of the coil CL1 (CL2) (isolator IS1 or IS2) (see FIG. 7) can be stabilized. The circuit characteristics may include signal transmission speed and noise resistance.

The shield pattern SD1 (SD2) is electrically coupled to a reference potential (for example, ground GND 0 V) through the wirings W. Even in a floating state, the shield pattern SD1 (SD2) can stabilize the circuit characteristics of the coil CL1 (CL2), but when the pattern is electrically coupled to the reference potential, the circuit characteristics of the coil CL1 (CL2) (isolator IS1 or IS2) can be more stabilized.

In plan view, the coverage of the shield pattern SD1 (SD2) is larger than the diameter of the coil CL1 (CL2). Instead, it is acceptable that the coverage of the shield pattern SD1 (SD2) is the same as the diameter of the coil CL1 (CL2) in plan view. However, when the shield pattern SD1 (SD2), extending outward from the outer circumferential end of the coil CL1 (CL2), is larger than the coil CL1 (CL2) by length X of about several tens of micrometers, the circuit characteristics of the coil CL1 (CL2) can be more stabilized. The other constituent elements and effects are the same as in the first embodiment.

A shield pattern may be provided only in one of the chips. In other words, it is also acceptable that one chip has a shield pattern and the other chip does not have a shield pattern.

<Variation 2 of the First Embodiment>

Figure 22:
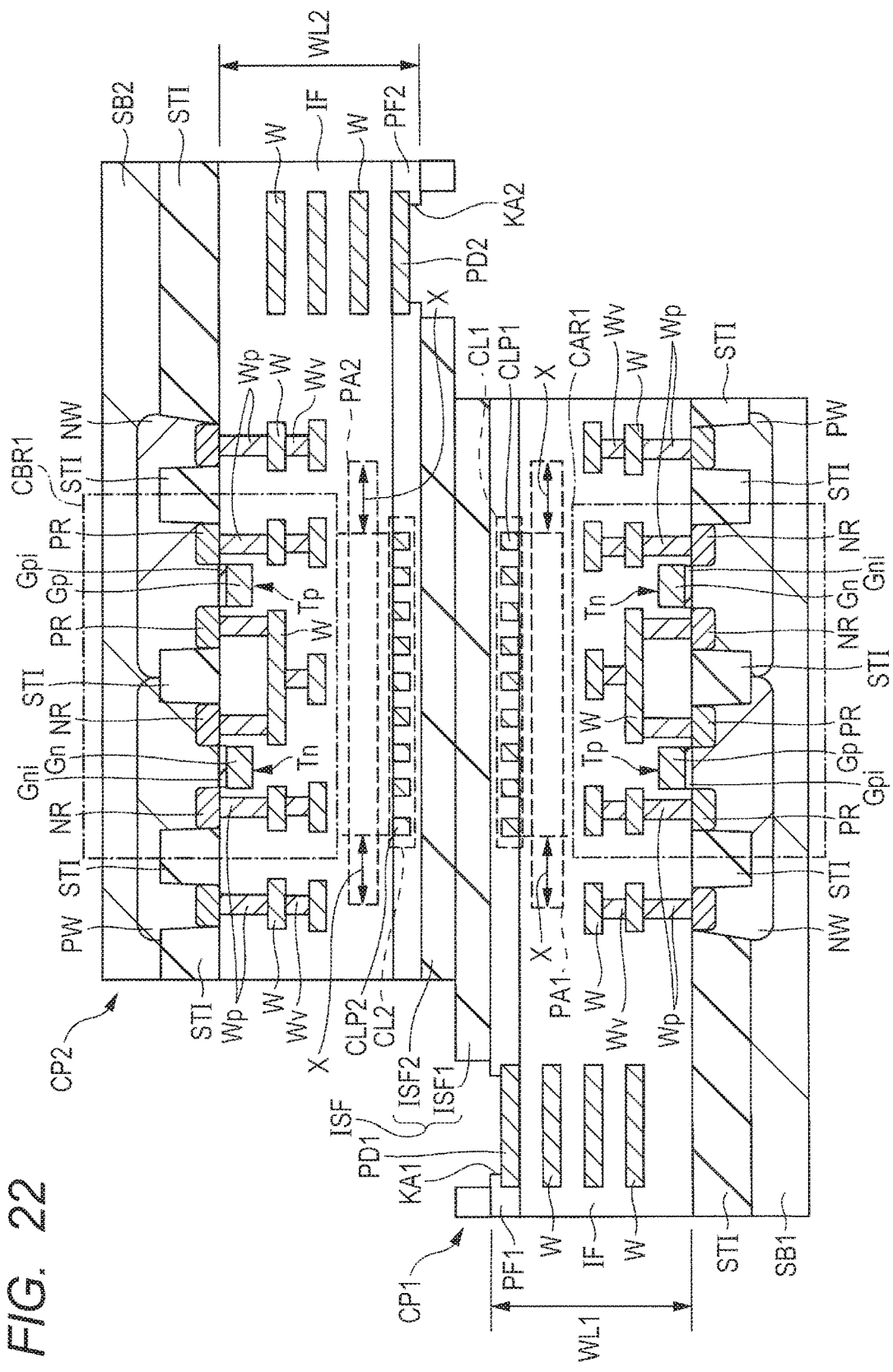
FIG. 22 is a schematic sectional view of two chips which configure a semiconductor device according to Variation 2.

Next, an example of the configuration of the chips CP1 and CP2 according to Variation 2 of the first embodiment will be described referring to FIG. 22. FIG. 22 is a schematic sectional view of two chips which configure a semiconductor device according to Variation 2. In FIG. 22, a sealing body MB, leads LD, and wires BW are omitted as in FIG. 12 and these constituent elements are the same as in the first embodiment shown in FIG. 9.

In Variation 2, in the chips CP1 and CP2, wiring prohibition areas (first wiring prohibition area and second wiring prohibition area) PA1 and PA2 are arranged in the wiring layers just under (one level lower than) the uppermost wiring layers in which the coils CL1 and CL2 are located, respectively. The wiring prohibition areas PA1 and PA2 are located in a manner to cover the coil CL1 and CL2 entirely in plan view, respectively. In the wiring prohibition areas PA1 and PA2, no wirings W for the circuit are provided. Even in the wiring layer where the wiring prohibition area PA1 (PA2) is located, a wiring W lies in an area which does not overlap the coil CL1 (CL2) in plan view.

Due to the presence of the wiring prohibition area PA1 (PA2), the distance between the coil CL1 (CL2) and the wiring W in the wiring layer just under the coil CL1 (CL2) can be longer than when a wiring W lies in the wiring layer one level lower than the coil CL1 (CL2). Since it is known that the wiring capacity is inversely proportional to the distance between wirings, when the distance between the coil CL1 (CL2) and the wiring W in the wiring layer lower than the coil CL1 (CL2) is longer, the wiring capacity between the coil CL1 (CL2) and the wiring W in the wiring layer lower than the coil CL1 (CL2) is decreased. Therefore, the circuit characteristics of the coil CL1 (CL2) (isolator IS1 or IS2) can be stabilized.

Figure 23:
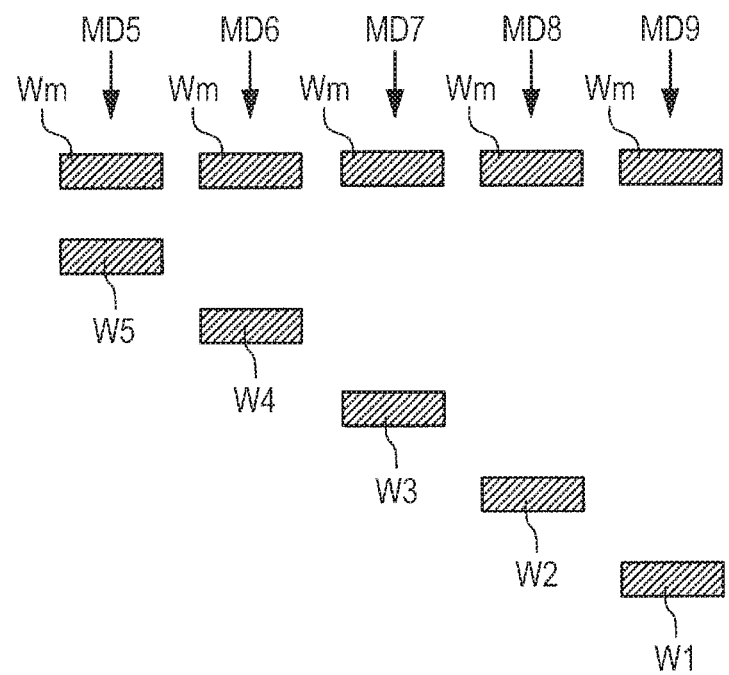
FIG. 23 is a sectional view which shows several models of the wiring structure of a multilayer wiring layer.

FIG. 23 shows several models of the wiring structure of the multilayer wiring layer. In the example shown here, the multilayer wiring layer includes six wiring layers. The sixth layer is the uppermost wiring layer in which wiring Wm lies. Model MD5 represents a case that wiring W5 lies in the wiring layer just under (one level lower than) the wiring Wm in the uppermost wiring layer. Model MD6 represents a case that no wiring lies in the wiring layer (fifth layer) one level lower than the wiring Wm in the uppermost wiring layer and wiring W4 lies in the wiring layer (fourth layer) two levels lower. Model MD7 represents a case that no wirings lie in the fourth and fifth wiring layers and wiring W3 lies in the third wiring layer. Model MD8 represents a case that no wirings lie in the third to fifth wiring layers and wiring W2 lies in the second wiring layer. Model MD9 represents a case that no wirings lie in the second to fifth wiring layers and wiring W1 lies in the first wiring layer.

Figure 24:
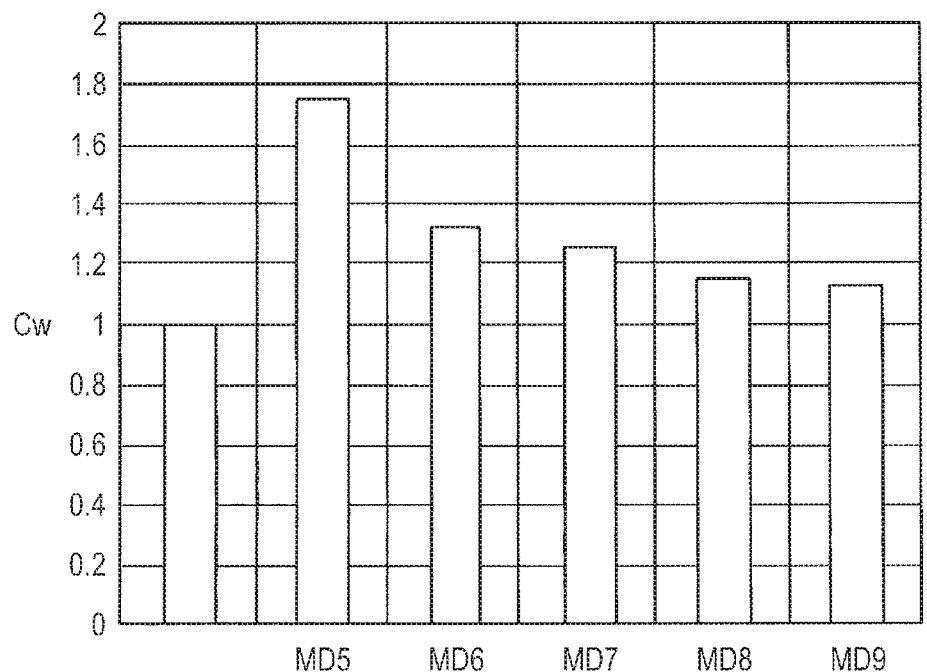
FIG. 24 is a graph which shows the result of simulation of the wiring capacity of each of the models shown in FIG. 23.

FIG. 24 shows the result of wiring capacity simulation of the models MD5 to MD6 shown in FIG. 23. In FIG. 24, the vertical axis denotes wiring capacity Cw. From FIG. 24, it is known that the wiring capacity of the model MD5 (wiring W5 lies in the wiring layer one level lower than the wiring Wm in the uppermost wiring layer) is remarkably large. In contrast, there is no significant difference in wiring capacity among the models MD6 to MD9 (no wiring lies in the wiring layer one level lower than the wiring Wm in the uppermost wiring layer). This suggests that the wiring capacity is decreased by eliminating the wiring in the wiring layer one level lower than the wiring Wm. Therefore, by eliminating only the wiring in the wiring layer one level lower than the coil CL1 (CL2), the wiring capacity between the coil CL1 (CL2) and wirings W can be decreased and wirings W can be provided in the wiring layers two or more levels lower than the coil CL1 (CL2) in order to form a circuit.

In plan view, the coverage of the wiring prohibition area PA1 (PA2) is larger than the diameter of the coil CL1 (CL2). Instead, it is acceptable that the coverage of the wiring prohibition area PA1 (PA2) is the same as the diameter of the coil CL1 (CL2) in plan view. However, when the wiring prohibition area, extending outward from the outer circumferential end of the coil CL1 (CL2), is larger than the coil CL1 (CL2) by about length X of several tens of micrometers, the circuit characteristics of the coil CL1 (CL2) (isolator IS1 or IS2) can be more stabilized. The other constituent elements and effects are the same as in the first embodiment.

A wiring prohibition area may be provided only in one of the chips. In other words, it is acceptable that one of the chips has a wiring prohibition area and the other chip does not have a wiring prohibition area. Furthermore, Variation 1 and Variation 2 may be combined. Specifically, while a shield pattern may be provided in one of the chips, a wiring prohibition area may be provided in the other chip.

Second Embodiment

Figure 25:
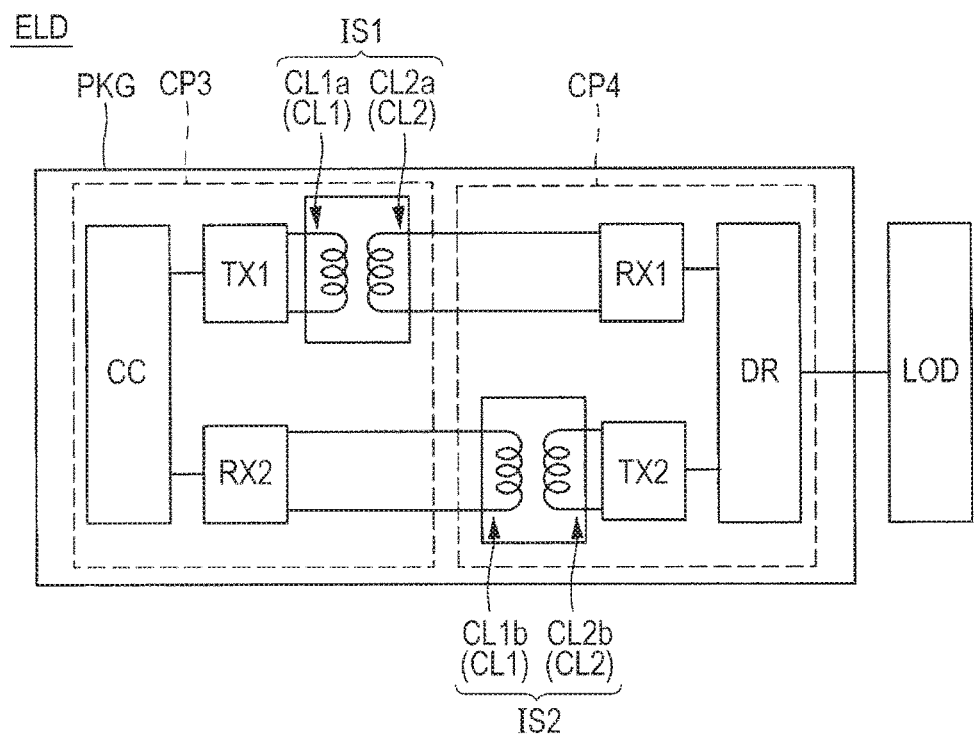
FIG. 25 is a circuit diagram of another example of an electronic device using a semiconductor device according to a second embodiment of the invention.

FIG. 25 is a circuit diagram of another example of an electronic device using a semiconductor device according to the second embodiment of the invention.

In the electronic device ELD shown in FIG. 25, an isolator IS1 is provided inside a chip CP3 (multilayer wiring layer) and an isolator IS2 is provided inside a chip CP4 (multilayer wiring layer). The other constituent elements are the same as in FIG. 7. Here, the chips CP3 and CP4 can be considered as semiconductor devices.

Figure 26:
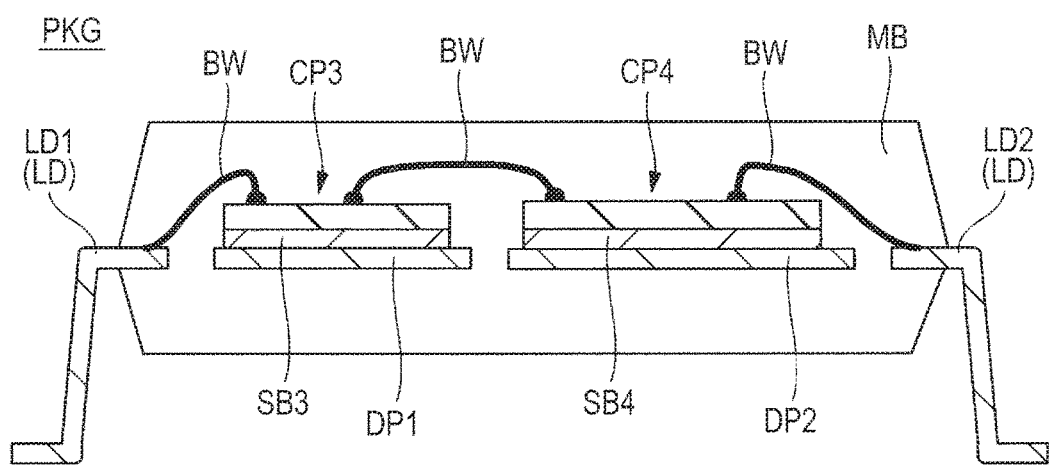
FIG. 26 is a sectional view of a package according to the second embodiment.

FIG. 26 is a sectional view of the package according to the second embodiment. In FIG. 26, hatching for a sealing body MB is omitted for easy understanding of the illustration.

In the second embodiment, in the sealing body MB of the package PKG, the chips CP3 and CP4 are not stacked but arranged side by side in the same plane. Specifically, the chip CP3 (CP4) is mounted over the die pad DP1 (DP2) through a die bond (not shown) with the main surface (fifth surface) of the semiconductor substrate SB3 (SB4) up and the back surface (sixth surface) opposite to the main surface of the semiconductor substrate SB3 (SB4) facing the die pad DP1 (DP2). The circuit of the chip CP3 and the circuit of the chip CP4 are electrically coupled through wires BW. The other constituent elements are the same as in FIG. 9.

FIG. 27 is a schematic sectional view of a chip which configures the semiconductor device according to the second embodiment. The chips CP3 and CP4 are the same in terms of isolator structure and the structure of the chip CP3 is explained below.

In the second embodiment, a multilayer wiring layer WL3 is provided over the main surface (fifth surface) of a semiconductor substrate SB3. For example, the multilayer wiring layer WL3 includes the same multilayer wiring layer WL1 as the above one and a rewiring layer RWL lying over the layer WL1.

In this example, a primary coil (third coil) CL1 of the isolator IS1 is formed in the third wiring layer of the multilayer wiring layer WL1. Therefore, the coil CL1 is made of the same material and at the same formation step as the wiring W in the third wiring layer. The other constituent elements of the coil CL1 are the same as in the first embodiment.

A pad PD1 as part of wiring W in the fourth wiring layer is formed in the fourth wiring layer of the multilayer wiring layer WL1. A surface protective film PF1 is formed over the insulating film IF of the multilayer wiring layer WL1 in a manner to cover the pad PD1, etc. and a rewiring RWL layer is formed over the surface protective film PF1. In short, a rewiring RW is formed over the surface protective film PF1 through an insulating film LF.

The insulating film LF is, for example, a polyimide film. The polyimide film is a kind of organic insulating film of a polymer containing repeating imide groups. For the insulating film LF, not only polyimide film but also other types of organic insulating film, such as epoxy, PBO, acryl, and WRP resin films, may be used. Polyimide resin is an organic resin suitable for use in a device which requires high heat resistance of 200° C. or more. The organic resin as the material of the insulating film LF can be selected according to mechanical strength factors such as coefficient of thermal expansion and ductility, cure temperature and so on.

The rewiring RW is wiring which leads the pad PD1 to the desired area of the chip CP3. Specifically, one end of the rewiring RW is joined to the pad PD1 through an opening KA1 made in the insulating film LF and surface protective film PF1. The other end of the rewiring RW extends to the desired area which does not overlap the pad PD1 in plan view. The rewiring RW has, for example, a laminated structure which includes a metal film, such as a copper film, lying over an underlying metal film. The underlying metal film is a laminated film which includes, for example, a nickel (Ni) film and a gold (Au) film lying over the nickel (Ni) film. In the second embodiment, the rewiring layer RWL is the uppermost wiring layer.

In the second embodiment, a coil region CLR is located in a position away from (namely, in a manner not to overlap) the area in which the pad PD1 and rewiring RW are located. In the coil region CLR, a secondary coil (fourth coil) CL2 of the isolator IS1 is formed in the rewiring layer RWL. The conductor pattern CLP2 of the coil CL2 is made of the same material and at the same formation step as the rewiring RW. The other constituent elements of the coil CL2 are the same as in the first embodiment.

The coil CL2 in the rewiring layer RWL faces the coil CL1 in the multilayer wiring layer WL1 as in the first embodiment. However, unlike the first embodiment, the coils CL1 and CL2 are formed in different wiring layers of the chip CP3. Specifically, several insulating films in the chip CP3 lie between the coils CL1 and CL2. Like the first embodiment, the coils CL1 and CL2 are insulated from each other by the insulating films but magnetically coupled when the isolator IS1 is operated.

As mentioned above, in the isolator, a large potential difference may occur between the primary coil and secondary coil, so it is important to increase the dielectric voltage between the primary coil and secondary coil as much as possible.

Particularly when an isolator (primary coil and secondary coil) is formed in a chip, because of the growing tendency toward thinner chips it is difficult to ensure sufficient insulating film thickness between the primary coil and secondary coil. Therefore, some means to ensure the required dielectric voltage between the primary coil and secondary coil is needed.

For the above reason, in the second embodiment, the secondary coil CL2 is formed in the rewiring layer RWL so as to endure the required dielectric voltage between the coils CL1 and CL2. More specifically, in the second embodiment, a laminated insulating film (second insulating film), which includes part of the insulating film IF (silicon oxide film covering the wiring W in the third wiring layer), the surface protective film PF1 (laminated film of silicon oxide film and silicon nitride film), and the insulating film LF (resin film such as polyimide film), lies between the coils CL1 and CL2. Consequently, the required distance between the coils CL1 and CL2 is ensured and a high-resistance insulating film (resin film such as polyimide film) can be interposed between the coils CL1 and CL2 so that the required dielectric voltage between the coils CL1 and CL2 is ensured.

In the second embodiment too, the coil region CLR, in which the coils CL1 and CL2 are located, overlaps part (region CAR1) of the circuit region CAR (see FIGS. 9 and 10, etc.) in plan view. Consequently, the size of the chip CP3 can be small as in the first embodiment.

An insulating surface protective film PF3 is formed over the insulating film LF in a manner to cover the rewiring RW and coil CL2. The surface protective film PF3 protects the rewiring RW and coil CL2. The surface protective film PF3 is the uppermost surface film of the chip CP3. Preferably, the surface protective film PF3 is resin film, such as polyimide film.

An opening KA3 is made in part of the surface protective film PF3 and part of the surface of the rewiring RW (part of the surface of the remoter rewiring portion from the pad PD1) is exposed from the opening KA3. The part of the rewiring RW which is exposed from the opening KA3 is a pad PD3. One end of a wire BW is joined to the pad PD3. Although the surface protective film PF3 is omissible, the surface protective film PF3 protects the rewiring RW and coil CL2, which improves the reliability and makes it easy to handle the chip CP3.

In the second embodiment too, a shield pattern may be provided in a wiring layer one level lower than the primary coil CL1 in the multilayer wiring layer WL1 or WL2 of the chip CP3 or CP4, like Variation 1 of the first embodiment. Also, in the second embodiment too, a wiring prohibition area may be provided in a wiring layer one level lower than the primary coil CL1 of the multilayer wiring layer WL1 or WL2 of the chip CP3 or CP4, like Variation 2 of the first embodiment.

The invention made by the present inventors has been so far explained concretely in reference to the preferred embodiments thereof. However, the invention is not limited to the above embodiments and it is obvious that these details may be modified in various ways without departing from the gist thereof.

What is claimed is:

1. A semiconductor device comprising:
    a first semiconductor chip;
    a second semiconductor chip located opposite to the first semiconductor chip;
    a first insulating film interposed between the first semiconductor chip and the second semiconductor chip facing each other; and
    a sealing body sealing the first semiconductor chip, the second semiconductor chip, and the first insulating film,
    the first semiconductor chip comprising:
        a first semiconductor substrate having a first surface and
        a second surface opposite to the first surface;
        a first multilayer wiring layer provided between the first surface of the first semiconductor substrate and the first insulating film, the first multilayer wiring layer including a first wiring for a first integrated circuit; and
        a first coil provided in the first multilayer wiring layer,
    the second semiconductor chip comprising:
        a second semiconductor substrate having a third surface facing the first surface of the first semiconductor chip and a fourth surface opposite to the third surface;
        a second multilayer wiring layer provided between the third surface of the second semiconductor substrate and the first insulating film, the second multilayer wiring layer including a second wiring for a second integrated circuit;
        a second coil provided in the second multilayer wiring layer, facing the first coil through the first insulating film, and magnetically coupled to the first coil; and
    the second wiring for the second integrated circuit formed just above the second coil,
    wherein the first coil is located in a manner to overlap part of a first circuit region located in the first surface of the first semiconductor substrate in plan view,
    wherein the second coil is located in a manner to overlap part of a second circuit region located in the third surface of the second semiconductor substrate in plan view,
    wherein the first wiring is located just under the first coil, and
    wherein the second wiring is located just above the second coil.

2. The semiconductor device according to claim 1, wherein an operating frequency of the first coil and the second coil during operation is 200 MHz or less.

3. The semiconductor device according to claim 1,
    wherein in the first multilayer wiring layer, a first shield pattern is provided in a wiring layer one level lower than the first coil in a manner to overlap the first coil in plan view, and
    wherein in the second multilayer wiring layer, a second shield pattern is provided in a wiring layer one level lower than the second coil in a manner to overlap the second coil in plan view.

4. The semiconductor device according to claim 3, wherein the first shield pattern and the second shield pattern are electrically coupled to a reference potential.

5. The semiconductor device according to claim 3, wherein the first shield pattern and the second shield pattern are larger than a diameter of the first coil and the second coil in plan view.

6. The semiconductor device according to claim 1, wherein in the first multilayer wiring layer, a first wiring prohibition area is provided in a wiring layer one level lower than the first coil in a manner to overlap the first coil in plan view, and
wherein in the second multilayer wiring layer, a second wiring prohibition area is provided in a wiring layer one level lower than the second coil in a manner to overlap the second coil in plan view.

7. The semiconductor device according to claim 6, wherein the first wiring prohibition area and the second wiring prohibition area are larger than a diameter of the first coil and the second coil in plan view.

8. The semiconductor device according to claim 1, wherein a digital circuit is provided in the part of each of the first circuit region and the second circuit region.

9. A semiconductor device comprising:
a semiconductor substrate having a first surface and a second surface opposite to the first surface;
a multilayer wiring layer provided over the first surface of the semiconductor substrate, the multi multilayer wiring including a first wiring for an integrated circuit;
a first coil provided in the multilayer wiring layer;
a second coil provided in the multilayer wiring layer, facing the first coil, and magnetically coupled to the first coil; and
a second insulating film interposed between the first coil and the second coil,
wherein the first coil is located in a wiring layer lower than the second coil,
wherein the first coil and the second coil are arranged in a manner to overlap part of a circuit region provided in the first surface of the semiconductor substrate in plan view, and
wherein the first wiring is located just under the first coil.

10. The semiconductor device according to claim 9, wherein an operating frequency of the first coil and the second coil during operation is 200 MHz or less.

11. The semiconductor device according to claim 9, wherein in the multilayer wiring layer, a shield pattern is provided in a wiring layer one level lower than the first coil in a manner to overlap the first coil in plan view.

12. The semiconductor device according to claim 11, wherein the shield pattern is electrically coupled to a reference potential.

13. The semiconductor device according to claim 11, wherein the shield pattern is larger than a diameter of the first coil and the second coil in plan view.

14. The semiconductor device according to claim 9, wherein in the multilayer wiring layer, a wiring prohibition area is provided in a wiring layer one level lower than the first coil in a manner to overlap the first coil in plan view.

15. The semiconductor device according to claim 14, wherein the wiring prohibition area is larger than a diameter of the first coil and the second coil in plan view.

16. The semiconductor device according to claim 9, wherein a digital circuit is provided in the part of the circuit region.

* * * * *